(12) United States Patent
Tanaka

(10) Patent No.: US 7,430,695 B2
(45) Date of Patent: Sep. 30, 2008

(54) REGISTER FILE AND ITS STORAGE DEVICE

(75) Inventor: Tomohiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 165 days.

(21) Appl. No.: 11/320,984

(22) Filed: Dec. 30, 2005

(65) Prior Publication Data
US 2006/0123295 A1    Jun. 8, 2006

Related U.S. Application Data

(63) Continuation of application No. PCT/JP03/11410, filed on Sep. 8, 2003.

(51) Int. Cl.
*G11C 29/00* (2006.01)
*G11C 7/00* (2006.01)
(52) U.S. Cl. .................... 714/718; 365/200
(58) Field of Classification Search ............ 714/718
See application file for complete search history.

(56) References Cited

U.S. PATENT DOCUMENTS

| | | | |
|---|---|---|---|
| 5,450,418 A | | 9/1995 | Ganapathy |
| 5,627,784 A | * | 5/1997 | Roohparvar ............ 365/189.01 |
| 6,351,807 B1 | * | 2/2002 | Yoder et al. ............. 712/228 |

FOREIGN PATENT DOCUMENTS

| | | | |
|---|---|---|---|
| EP | 604 032 A2 | | 6/1994 |
| JP | 63-64692 | | 3/1988 |
| JP | 04181599 A | * | 6/1992 |
| JP | 5-109299 | | 4/1993 |
| JP | 6-230088 | | 8/1994 |

OTHER PUBLICATIONS

"A Current-Sensed High-Speed and Low-Power First-In-First-Out Memory Using a Wordline/Bitline-Swapped DualPport SRAM Cell" by Shibata et al. IEEE Journal of Solid-State Circuits, Pub Date: Jun. 2002 vol. 37, Issue: 6 On pp. 735-750 ISSN: 0018-9200 INSPEC Accession No. 7297338.*

* cited by examiner

*Primary Examiner*—Cynthia Britt
(74) *Attorney, Agent, or Firm*—Staas & Halsey LLP

(57) ABSTRACT

A register file device has a memory array, a scan connection configuration circuit, a file writing unit, a file reading unit, and a scan control circuit. The memory includes first storage devices which are obtained by adding shift transfer gate and an output gate to a master flip-flop only latch in a conventional register file using master flip-flop only latch storage devices, and a scan connection configuration circuit and a scan control circuit using master flip-flop only second storage devices are added thereto to realize the scan function of internally constituting a shift register and reading contents thereof in testing. The size of the register file is reduced by using master flip-flop only latch storage devices, and a high test/diagnosis efficiency is achieved by using the internal scan function in master-slave type flip-flop (2 latches) storage devices.

9 Claims, 20 Drawing Sheets

PRIOR ART
FIG. 6A CK0 
FIG. 6B CK1 
FIG. 6C CK2 
FIG. 6D D 
FIG. 6E Q 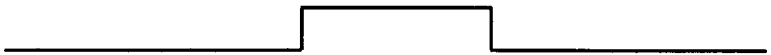
PRIOR ART
FIG. 7A CK0 
FIG. 7B CK1 
FIG. 7C CK2 
FIG. 7D SI 
FIG. 7E Q 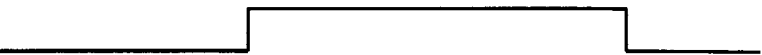
FIG. 7F SO 

FIG. 10E

| D13 | D14 | D15 | D16 |
| D09 | D10 | D11 | D12 |
| D05 | D06 | D07 | D08 |
| D01 | D02 | D03 | D04 |

FIG. 10F

| D02 | D03 | D04 | |
| D13 | D14 | D15 | D16 |
| D09 | D10 | D11 | D12 |
| D05 | D06 | D07 | D08 |

FIG. 10G

| D02 | D03 | D04 | S01 | ← S01
| D13 | D14 | D15 | D16 |
| D09 | D10 | D11 | D12 |
| D05 | D06 | D07 | D08 |

FIG. 10H

| D02 | D03 | D04 | S01 |
| D13 | D14 | D15 | D16 |
| D09 | D10 | D11 | D12 |
| | | | |
D05 ← | D05 | D06 | D07 | D08 |

FIG. 10I

| D06 | D07 | D08 | S02 |
| D02 | D03 | D04 | S01 |
| D13 | D14 | D15 | D16 |
| D09 | D10 | D11 | D12 |
|     |     |     |     |

FIG. 10J

| D10 | D11 | D12 | S03 |
| D06 | D07 | D08 | S02 |
| D02 | D03 | D04 | S01 |
| D13 | D14 | D15 | D16 |
|     |     |     |     |

FIG. 10K

| S03 | S07 | S11 | S15 |
| S02 | S06 | S10 | S14 |
| S01 | S05 | S09 | S13 |
| D16 | S04 | S08 | S12 |
|     |     |     |     |

FIG. 10L

| S04 | S08 | S12 | S16 |
| S03 | S07 | S11 | S15 |
| S02 | S06 | S10 | S14 |
| S01 | S05 | S09 | S13 |
|     |     |     |     |

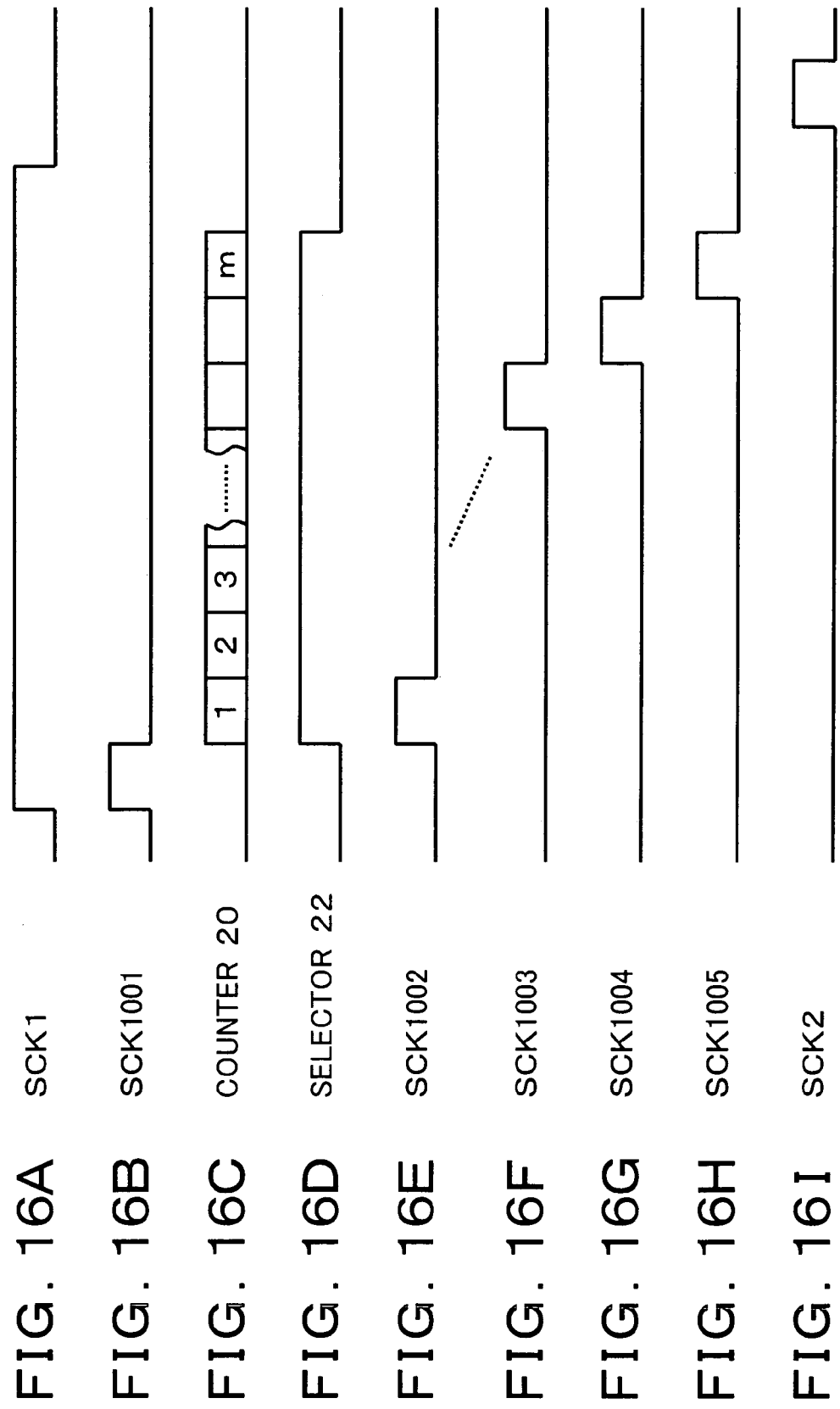

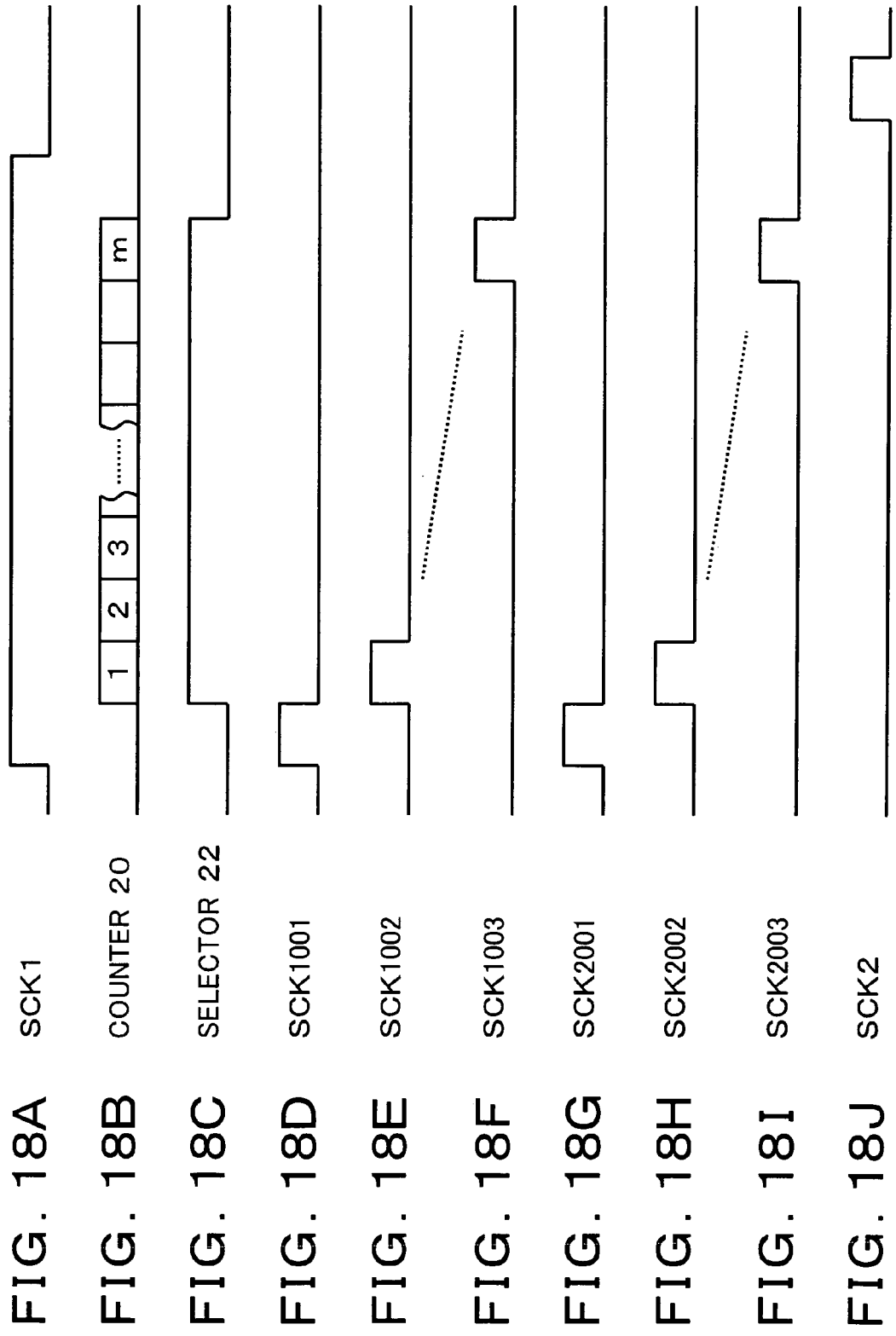

US 7,430,695 B2

REGISTER FILE AND ITS STORAGE DEVICE

This application is a continuation of PCT/JP03/11410, filed Sep. 8, 2003.

TECHNICAL FIELD

The present invention relates to a register file and its storage device used as a register in a CPU, MPU or the like, and particularly to a register file integrally comprising a scan circuit for serially connecting storage devices on testing to constitute a shift register, and reading contents thereof, and its storage device.

BACKGROUND ART

Conventionally, there has been employed a register file which is a storage apparatus which is a collection of storage devices and in which reading can be performed faster than in DRAM or SRAM as a register of a computer such as CPU or MPU. A circuit for this register file is designed to be small and to operate at high speed, and is configured so that diagnosis on manufacturing a semiconductor chip is performed at high speed and high efficiency, thereby achieving improvement in performance of the semiconductor chip and reduction in manufacturing cost.

A structure of a conventional basic register file is realized so that a write address decoder circuit 204, a read address decoder circuit 206 and a read select circuit 208 are added to a memory array 200 in an array structure where storage devices 202 are arranged as shown in FIG. 1.

Here, the storage devices 202 used for the register file have the following two types, each of which has a merit and a demerit.

(1) Master flip-flop only latch
(2) Flip-Flop in a master-slave structure

In other words, when a master flip-flop only latch is assumed as a storage device, there is a merit that it can made small in size but there is a demerit that a scan circuit cannot be formed therein. On the other hand, when a flip-flop in a master-slave structure is assumed as a storage device, there is a merit that a scan circuit can be formed therein but there is a demerit that the size is made twice or more than the master flip-flop only latch.

Here, the scan circuit connects in series storage devices in a semiconductor chip constituting a register file in a path different from that in a normal operation and constitutes a shift register, which operates only at the time of testing the semiconductor chip.

FIG. 2 shows a register file at a normal time, and exemplifies a case where the memory array 200 is constituted of (3×4)=12 storage devices in (address direction)×(data direction) for simplified explanation. As for data writing in the memory array 200, the write address decoder circuit 204 in FIG. 1 decodes a write address to select four storage devices 202 in the data direction in a specific register and to write 4-bit data in parallel. As for data reading from the memory array 200, a read address decoder circuit 106 in FIG. 1 decodes a read address to select a read bus, which is a collection of read lines, from the four storage devices 202 in the specific register by the read selector circuit 208 and to read 4-bit data in parallel.

FIG. 3 shows a shift register constituted of the scan circuit at the time of testing when the flip-flop in the master-slave structure is assumed as the storage device, where the storage devices 202 in the memory array 200 are connected in series in a path different from that in the normal operation to constitute a shift register. This scan circuit can be used to observe the state of the storage devices inside the semiconductor chip, which is originally invisible, or to perform defective inspection (diagnosis) at high speed and high efficiency at the time of manufacturing a semiconductor chip in a demonstration test. That is, how many scan functions the storage devices in the semiconductor chip can have is a key as to whether the high test efficiency and diagnosis efficiency can be realized.

FIG. 4 shows a master flip-flop only latch storage device used for the memory array 200 in FIG. 1, which is constituted of an input inversion inverter 210, a pair of connected-in-parallel gates 212 and 214 constituting a dual gate which is turned ON in response to a data clock CK0 and its inverted data clock XCK0, a pair of alternately feedback-connected inverters 216 and 218 constituting a latch 215, and an inversion output inverter 220. The operation thereof turns ON the gates 212 and 214, for example, in response to the data clock CK0 and XCK0, latches data D inverted in the inverter 210 into the latch 215, and inverts and outputs the same in the inverter 220.

FIG. 5 shows a master-slave type flip-flop storage device used for the memory array 200 in FIG. 1, where connection is established for the latch storage device circuit unit 222 identical to that in FIG. 4 from a shift input SI via the inverter 224 and the gates 226 and 228 constituting a dual gate to the latch 215 and a latch 234 which alternately feedback-connects the gates 230 and 232 constituting a dual gate and the gates 236 and 238, and the output inversion inverter 240 are provided from the latch 215 to a shift output SO. Here, the inverter 210, the gates 212, 214, the latch 215 and the inverter 220 constitute the master flip-flop used at the normal time as in FIG. 2, and the inverter 220, the gates 212, 214 and the latch 215 constitute the flip-flop in the master-slave structure used as the shift register for testing as in FIG. 3.

The operation at the normal time of the flip-flop storage device in the master-slave structure in FIG. 5 is as in the time charts of FIGS. 6A to 6E. At the normal operation, the clock CK1 and the clock CK2 for scan shift are fixed at level 0 as in FIGS. 6B and 6C without being input, and only the latch storage device circuit unit 222 operates. In other words, after the data D in FIG. 6D rises to level 1, the gate 212 is turned ON in response to the clock CK0 of FIG. 6A, the data is held in the latch 215 and inverted in the inverter 220 to perform latch operation where the output Q in FIG. 6E is at level 1.

The scan circuit operation such as testing is as in the time charts of FIGS. 7A to 7F. The clock CK0 of FIG. 7A is fixed at level 0 without being input, the clock CK1 of FIG. 7B is first input by 1 clock to turn ON the gate 230, and the data in the latch 215 is copied to the latch 234, and is inverted in the inverter 240 so that the data is output to the shift-out SO in FIG. 7F. After a sufficient time has elapsed, the clock CK2 is input by 1 clock as in FIG. 7C. A time until the clock CK2 is input is several-hundred times of the system operation cycle depending on the performance of the tester. When the clock CK2 is input by 1 clock to turn ON the gate 226, the data in the shift-in SI in FIG. 7D is set to the latch 215 to be the output Q in the inverter 220 in FIG. 7E. Hereinafter, this is repeated to realize the scan operation of the shift register as shown in FIG. 3.

In designing the register file, when the master flip-flop only latch is assumed as the storage device, the size thereof can be reduced, causing reduction in chip area and further improvement in performance and reduction in cost. However, since the scan circuit cannot be formed therein, it is necessary to additionally design a dedicate circuit outside the register file in place of the scan circuit for chip diagnosis or demonstration test. Thus, a gate is added to a critical path at the normal operation, causing reduction in performance. Further, since it causes increase in chip diagnosis pattern and diagnosis time for defective inspection, causing reduction in efficiency for demonstration test, increase in manufacture cost is finally caused.

Also, when the flip-flop in the master-slave structure is assumed as the storage device, the scan circuit can be internally formed as in FIG. 3 so that the diagnosis and demonstration test for the register file can be easily performed. However, as compared with being constituted of the master flip-flop only latch, the size becomes twice or more. This is because the master flip-flop only latch storage device is realized by the 10 transistors while the flip-flop storage device in the master-slave structure in FIG. 5 requires 22 transistors. This causes reduction in performance and increase in cost. When actually designing the chip, depending on various specifications or conditions, some register files employ the master flip-flop only latch storage devices for the size at the expense of diagnosis efficiency and demonstration test efficiency, alternatively other register files employ the flip-flop storage devices in the master-slave structure for the scan at the expense of the size. When the size or the manufacturing efficiency is considered as trade-off point, the difference therebetween is significantly large.

The fact that options of the storage device structure for the register file are extremes is a significant problem in designing a semiconductor chip. The storage device structure of the register file has to be determined at the initial time of design, and its determination is remarkably important. If the determination is erroneous and some change is required in the middle of the design, a large change in mounting is caused and terrible delay may occur. As described above, the fact that the options of the storage device structure for the register file are extremes is a significant problem.

It is an object of the present invention to provide a register file for enabling a scan circuit to be assembled only by slightly increasing the size of a semiconductor chip, thereby achieving high test diagnosis efficiency.

DISCLOSURE OF INVENTION

A register file according to the present invention is constituted of a memory array, a scan connection configuration circuit, a file writing unit, a file reading unit and a scan control circuit.

A memory array is configured so that a predetermined number of first storage devices each comprising a data input terminal, a data output terminal, a shift input terminal and a shift output terminal are arranged on address basis to constitute a plurality of registers, a shift output terminal of each first storage device at a front stage is connected to a shift input terminal of each first storage device in each register except for registers at the head address and the last address, a shift input terminal of a first storage device at the highest-order bit position in the head register is assumed as a shift register input terminal for inputting shift data from the outside, data in a data input terminal is latched in response to an input of a data clock for the each first storage device to be output to the data output terminal, and shift data in the shift input terminal is latched in response to an input of a shift clock for the each first storage device to be output to the shift output terminal.

A scan connection configuration circuit is configured so that second storage devices each comprising a shift input terminal and a shift output terminal as many as the first storage devices in a register in the memory array are arranged following the last register in the memory array, a shift input of each second storage device is connected with a latch output of each first storage device at the same bit position in the last register in the memory array, a shift output of each second storage device except for a second storage device at the least significant bit is connected to a shift input terminal of each first storage device at 1-bit higher position of the head register in the memory array, a shift output terminal of a second storage device at the least significant bit position is assumed as a shift register output terminal for outputting shift data to the outside, and data in the shift input terminal is latched in response to an input of a second shift clock for the each second storage device to be output to the shift output terminal.

A file writing unit designates an arbitrary address of the memory array and writes data on register basis. A file reading unit designates an arbitrary address of the memory array and reads data on register basis;

A scan control circuit is configured so that a first shift clock is input in the order of the last register in the scan connection configuration circuit and the memory array to the head register, data is first copied from each first storage device in the last register of the memory array to each second storage device in the scan connection configuration circuit in parallel, shift data is externally output from a second storage device at the least significant bit in the scan connection configuration circuit to the shift register output terminal, subsequently data is sequentially copied from each first storage device at an upper register in the memory array to each first storage device at a lower register in parallel, and then data in each second storage device except for the highest-order bit in the scan connection configuration circuit is copied in parallel into each first storage device except for the highest-order bit in the head register, a second shift clock is finally input into a first storage device at the highest-order bit at the head register to copy shift data input into a shift register input terminal from the outside, and the processing is repeated until the data held in the memory array at the time of starting to scan is finished to output from the shift register output terminal to the outside.

In the register file according to the present invention, a memory is constituted of first storage devices which are obtained by adding shift transfer gate and output to a master flip-flop only latch in a conventional register file using master flip-flop only latch storage devices, and a scan connection configuration circuit and scan control circuit using master flip-flop only second storage devices are added thereto to realize the scan function of internally constituting a shift register and reading contents thereof in testing, thereby obtaining a merit as size reduction of the register file using master flip-flop only latch storage devices and a merit as high test/diagnosis efficiency by the internal scan function in master-slave type flip-flop (2 latches) storage devices.

Here, the first storage device provided in the memory array comprises a data input inverter for inverting and inputting data in the data input terminal, a first gate circuit for turning ON in response to an input of a data clock for a data clock input terminal and passing output data of the data inverter, a second gate circuit for turning ON in response to an input of a shift clock for a shift clock input terminal and passing shift data of the shift input terminal, a latch circuit for feedback-connecting a pair of inverters to each other and inputting and latching data passed in response to turning-ON of the first gate circuit and the second gate circuit, a data output inverter connected to an input side of the latch circuit for outputting inverted data to the data output terminal, and a latch output inverter connected to an output side of the latch circuit for outputting inverted data to the shift output terminal. The number of storage devices for this register file is at least 14, thereby remarkably reducing the number of transistors to be used as compared with 22 conventional storage devices.

In addition the second storage device provided in the scan connection configuration circuit comprises an input inverter for inverting and inputting data in the shift input terminal, a gate circuit for turning ON in response to an input of a shift clock for a shift clock input terminal and passing shift data in the shift input terminal, a latch circuit for feedback-connecting a pair of inverters to each other and inputting and latching data passed in response to turning-ON of the gate circuit, and an output inverter connected to an input side of the latch circuit for outputting inverted data to the shift output terminal. This second storage device is the same as the conventional master flip-flop only storage device, and requires 10 transistors to be used.

Further, the scan control circuit in the register file comprise a counter for counting the number corresponding to the number of registers in the memory array, a control unit for outputting a first shift clock to the scan connection configuration circuit at a starting timing of a shift period for outputting one bit from the memory array, and outputting a memory array shift signal indicative of the remaining period to operate the counter, a decoder circuit for decoding a counting output of the counter and outputting a first shift clock in the order of the last register to the head register in the memory array following the scan connection configuration circuit, and a gate circuit for opening a gate of each register in response to a memory array shift signal from the control unit and passing a first shift clock from the decoder circuit.

Here, the decoder circuit in the scan control circuit is a write address decoder circuit in the file writing unit, and is further provided with a selector circuit for switching an input of a write address for the write address decoder circuit into an output of the counter in response to a memory array shift signal from the control unit. In this manner, the address decoder circuit in the file writing unit is used as an address decoder circuit for scan control, thereby further reducing a circuit portion to be added according to the present invention.

In the register file according to the present invention, when an address is deepened, the memory array is divided into at least two in an address direction, a shift register output terminal at the last register in the divided memory array at the front stage is connected to a shift register input terminal at the head register in the divided memory array at the rear stage, and the each divided memory array is operated in parallel by the scan control circuit. Thus, even when the number of registers in the memory array increases and the address is deepened, the memory array is divided to perform scan operation in parallel, thereby obtaining the scan processing time half the case where the memory array is not divided. Naturally, the number of divisions of the memory array can be increased to 3 or 4 as needed, thereby reducing the scan operation time depending on the number of divisions.

The present invention provides a storage device for register file used in a memory array. In other words, the present invention comprises, as a data input terminal, a data output terminal, a data clock terminal and a shift input terminal, a data input inverter for inverting and inputting data in the data input terminal, a first gate circuit for turning ON in response to an input of a data clock for a data clock input terminal and passing output data of the data inverter, a second gate circuit for turning ON in response to an input of a shift clock for a shift clock input terminal and passing shift data in the shift input terminal, a latch circuit for feedback-connecting a pair of inverters to each other and inputting and latching data passed in response to turning-ON of the first gate circuit and the second gate circuit, a data output inverter connected to an input side of the latch circuit for outputting inverted data to the data output terminal, and a latch output inverter connected to an output side of the latch circuit for outputting inverted data to the shift output terminal.

BRIEF DESCRIPTION OF DRAWINGS

FIGS. 6A to 6E are time charts at the normal operation of the storage device of FIG. 5;

FIGS. 7A to 7F are time charts at the scan operation of the storage device of FIG. 5;

FIGS. 10A to 10L are explanatory diagrams schematically showing a scan operation of the register file according to the present invention by exemplifying a memory array of (4 addresses)×(4 data);

FIGS. 16A to 16I are time charts of the scan operation of the embodiment of FIGS. 8A and 8B;

FIGS. 18A and 18J are time charts of the scan operation of the embodiment of FIGS. 17A and 17B.

BEST MODE FOR CARRYING OUT THE INVENTION

Figure 8A:
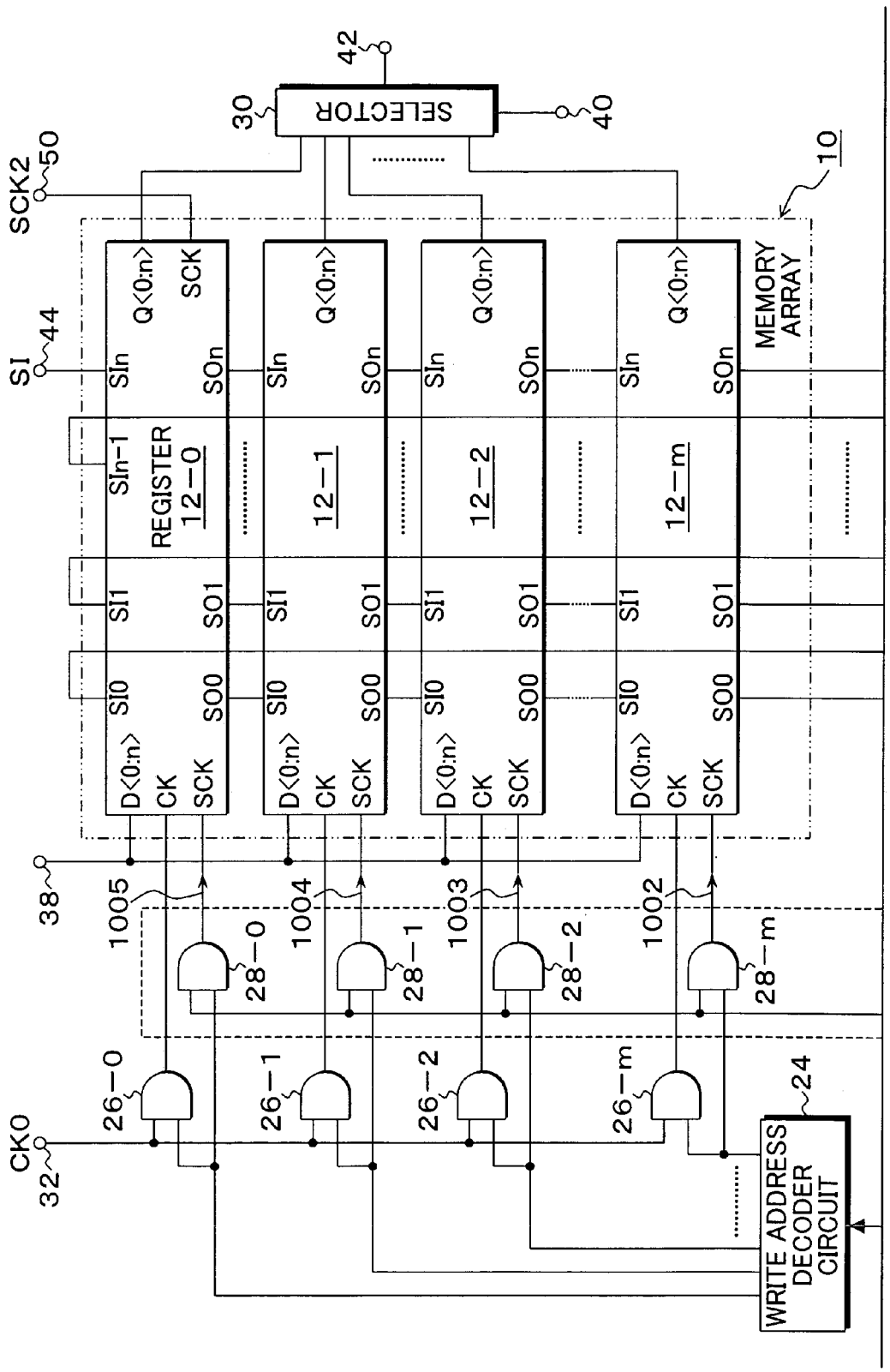
FIGS. 8A and 8B are circuit block diagrams of an embodiment of a register file according to the present invention.
Figure 8B:
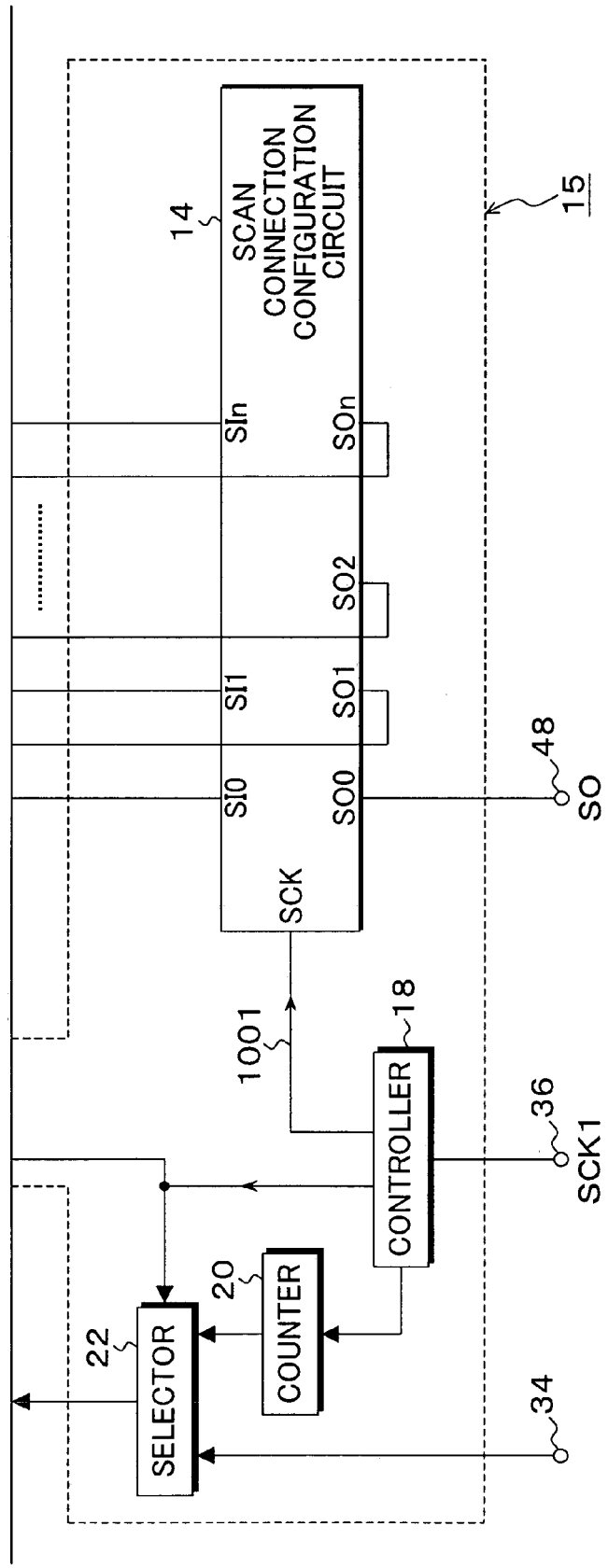

FIGS. 8A and 8B are circuit block diagrams of an embodiment of a register file according to the present invention. In FIGS. 8A and 8B, the register file according to the present invention has a memory array 10, and the memory array 10 is provided with registers 12-0, 12-1, 12-2, . . . , 12-m with the vertical direction as the address direction and the horizontal direction as the data direction. The registers 12-0 to 12-m arrange n+1 storage devices (first storage devices) in the data direction as the horizontal direction. A write address decoder circuit 24 and AND gates 26-0 to 26-m are provided as file writing units at the left of the memory array 10. A write address of the register is input into the write address decoder circuit 24 via a scan control circuit 16 according to the present invention described below from an address terminal 34, and this write address is decoded to generate a decode output for any one of the registers 12-0 to 12-m. Each decode output from the write address decoder circuit 24 is input to the AND gates 26-0 to 26-m, and a data clock CK0 is input thereto from a clock terminal 32. Thus, when the write address is decoded by the write address decoder circuit 24 to generate any one decode output, for example, a decode output for the register 12-0 at the first stage, the AND gate 26-0 enters the permitted state, the data clock CK0 is input as a write clock into the register 12-0 via the AND gate 26-0 and the write data is input as n+1-bit data from a data terminal 38 to be written in parallel into the n+1 storage devices in the register 12-0. A read selector circuit 30 constituting part of file reading units is provided at the right of the memory array 10. A read data bus with n+1-bit width is input and connected to the read selector circuit 30 from the respective registers 12-0 to 12-n to select a register output of the address designated by the output of a read address decoder circuit (not shown) for a selector input terminal 40 and to output it as read data from a terminal 42.

Figure 1:
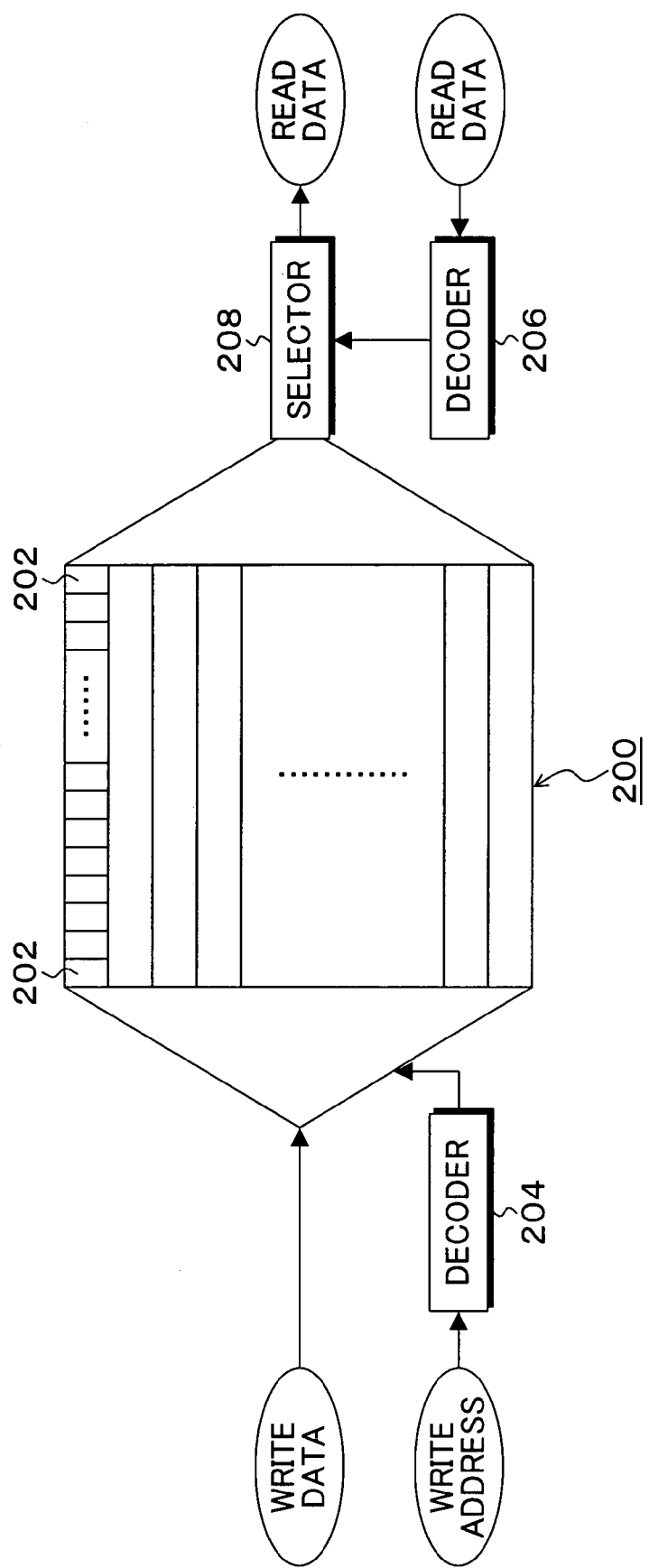
FIG. 1 is a block diagram of a basic structure of a conventional register file.
Figure 2:
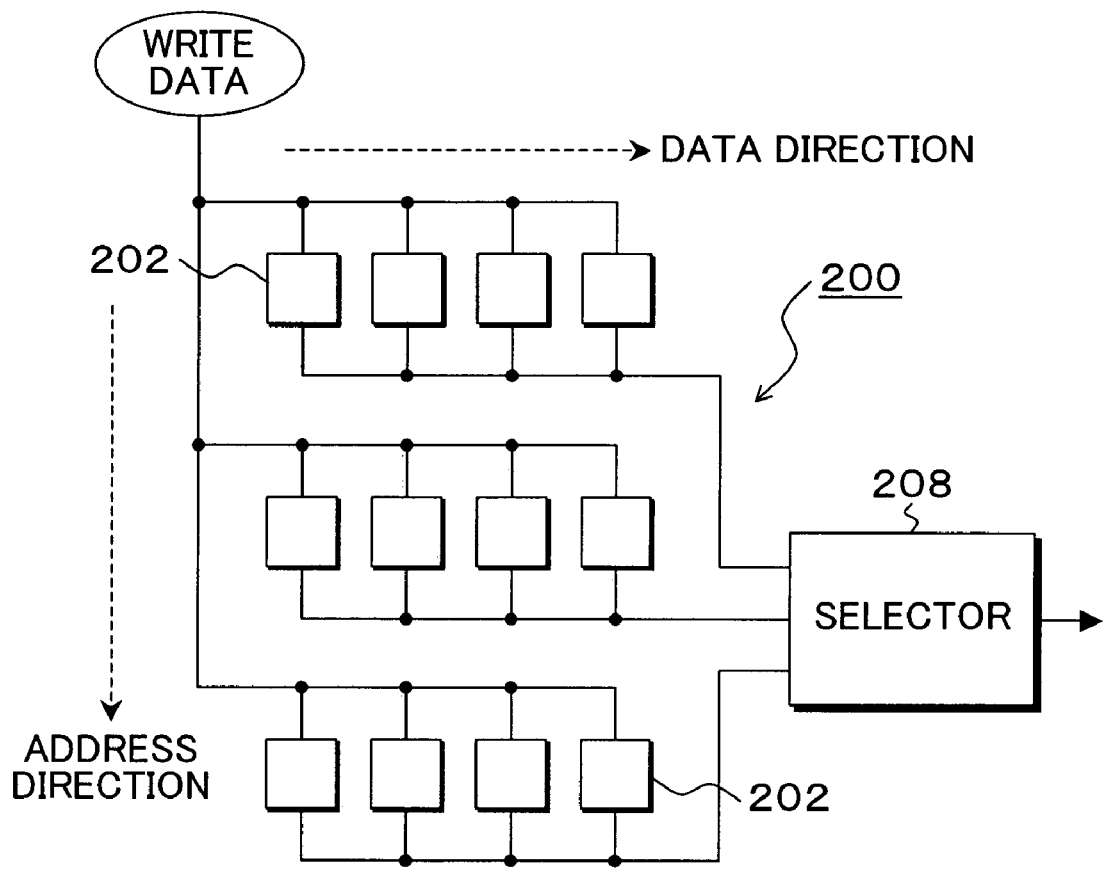
FIG. 2 is an explanatory diagram of a register file at the normal operation.
Figure 3:
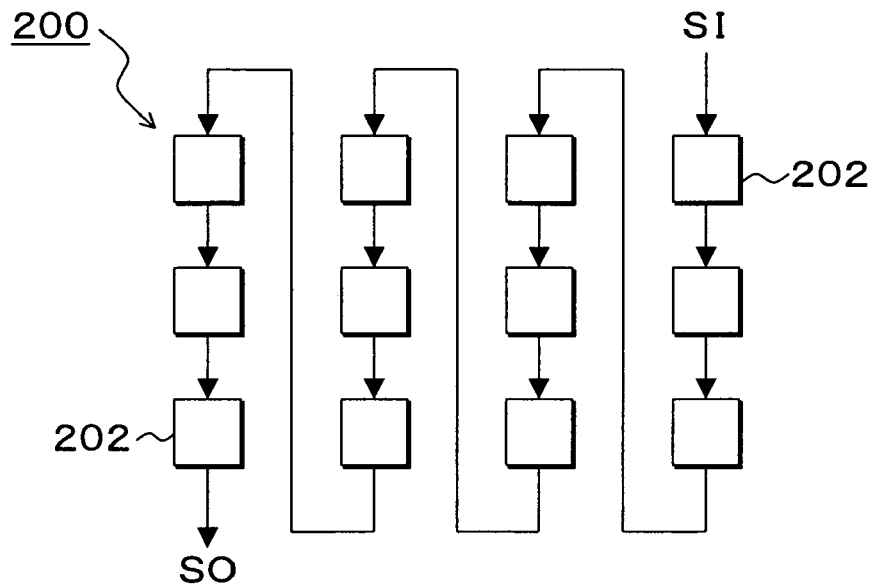
FIG. 3 is an explanatory diagram of a shift register structure constituted at the scan operation.
Figure 4:
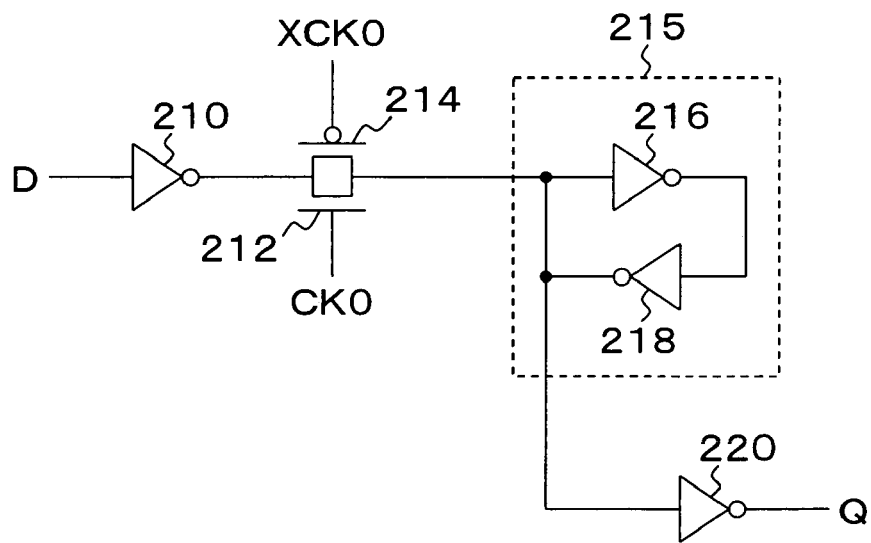
FIG. 4 is a circuit diagram of a conventional storage device constituted of a master flip-flop only latch.

In addition to the original circuit unit as such a register file, there is provided an additional circuit unit 15 added to the memory array 10 according to the present invention in order to perform scan operation at the time of testing. This additional circuit unit 15 is provided with a scan connection configuration circuit 14 and the scan control circuit 16. Further, in the present invention, in order to realize the scan function, as the storage devices used in the registers 12-0 to 12-m provided in the memory array 10, storage devices which are obtained by adding a shift input/output function to the storage devices using the typical master flip-flop only latch shown in FIG. 4 are used as described below. The scan connection configuration circuit 14 is arranged following the register 12-m at the last address in the memory array 10, and arranges storage devices (second storage devices) for n+1 bits similarly as in the register 12-m. The storage devices used in this scan connection configuration circuit 14 is the same as the master flip-flop only storage devices shown in FIG. 4 as explained below. The storage devices (first storage devices) used in the registers 12-0 to 12-m in the memory array 10 comprise shift input terminals and shift output terminals in addition to the data input terminals and the data output terminals, the shift input terminals in the registers 12-0 to 12-m are denoted as S0 to SIn and the shift output terminals are denoted as SO0 to SOn. The data input terminal D and the data output terminal Q in the storage device (first storage device) are the register-incorporated terminals. On the contrary, the storage devices (second storage devices) provided in the scan connection configuration circuit 14 have only the shift input terminals and the shift output terminals, and the shift input terminals are denoted as SI0 to SIn and the shift output terminals are denoted as SOn.

Each shift input terminal and shift output terminal in the registers 12-0 to 12-m and the scan connection configuration circuit 14 provided in the memory array 10 are connected to each other in order to realize the scan operation at the time of testing. First, an external shift register input terminal 44 is connected to the shift input terminal SIn at the highest-order bit n in the register 12-0 at the head address of the memory array 10. On the other hand, the shift output terminal SO0 at the least significant bit 0 in the scan connection configuration circuit 14 is connected to an external shift register output terminal 48. As for the shift connection between the registers 12-0 to 12-m, for example, taking the registers 12-0 and 12-1, the shift output terminals SO0 to SOn in the register 12-0 at the front stage are connected to the shift input terminals SI0 to SIn in the register 12-1 at the next stage, and this shift connection is similarly made also on the remaining registers 12-2 to 12-m. Further, the shift connection between the register 12-m at the last stage and the scan connection configuration circuit 14 is similarly made. On the other hand, as for the shift output in the scan connection configuration circuit 14, the shift outputs SO1 to SOn except for the shift output SO0 of the least significant bit are connected with the shift inputs SI0 to SIn−1 except for the highest-order bit in the register 12-0 at the head address potion in the memory array 10 with 1-bit shift by shift signal lines 46-1 to 46-n.

Figure 9:
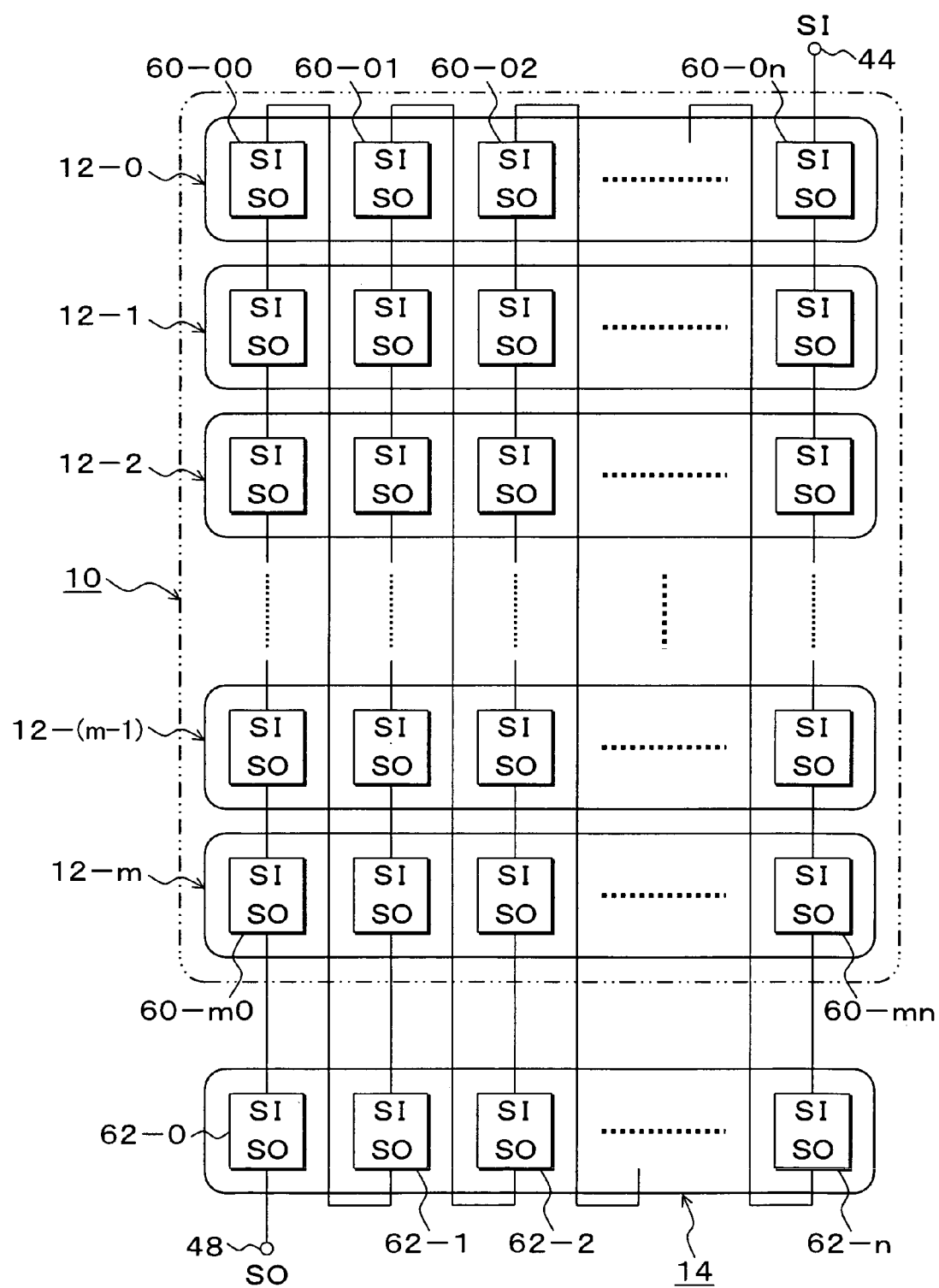
FIG. 9 is an explanatory diagram of interconnection of storage devices which are active at the scan operation according to the embodiment of FIGS. 8A and 8B.

FIG. 9 extracts a shift connection state for the scan operation in the memory array 10 and the scan connection configuration circuit 14 in FIGS. 8A and 8B. In FIG. 9, for example, taking a head register 12-0, the registers 12-0 to 12-m in the memory array 10 are provided with first storage devices 60-00 to 60-0n. The arrangement of the n+1 first storage devices is similar as in the remaining registers 12-1 to 12-m. The scan connection configuration circuit 14 is provided with second storage devices 62-0 to 62-n. The first storage devices 60-00 to 60-nm provided in the registers 12-0 to 12-m in the memory array 10 each have the data input terminal D and the data output terminal Q in addition to the shift input terminal SI and the shift output terminal SO, but the data input terminal D and the data output terminal Q are omitted here. On the contrary, the second storage devices 62-0 to 62-n in the scan connection configuration circuit 14 each have only the shift input terminal SI and the shift output terminal SO. At the time of the scan operation such as testing, as shown in FIG. 9, the first storage devices 60-00 to 60-mn in the memory array 10 and the second storage device 62-0 in the scan connection configuration circuit 14 are connected in series in the address direction from the external shift register input terminal 44, then return to the head and repeat this connection, and finally constitute a series circuit from the second storage device 62-0 in the scan connection configuration circuit 14 to the external shift register output terminal 48.

Turning to FIGS. 8A and 8B again, the additional circuit unit 15 according to the present invention is provided with the scan control circuit 16, and the scan control circuit 16 is constituted of a controller 18, a counter 20, a selector 22 and AND gates 28-0 to 28-m. The controller 18 is input with a shift signal SCK1 from a shift control terminal 36, and during this shift signal SCK1 being input, the memory array 10 and the scan connection configuration circuit 14 performs the shift operation of outputting 1 bit of the memory array 10 from the shift register output terminal 48 and inputting 1 bit from the shift register input terminal 44. Specifically, when the shift signal SCK1 is input, the controller 18 first inputs a first shift clock 1001 into the scan connection configuration circuit 14 and copies n+1-bit data in each storage device in the register 12-m at the last stage in the memory array 10 into the scan connection configuration circuit 14 so that the first 1-bit data is output to the shift register output terminal 48. Subsequently, the controller 18 performs counting operation where the counter 20 counts the number of registers in the memory array 10 while the remaining shift signal SCK1 is being obtained. A count output of the counter 20 is input into the selector 22. At the time of the scan operation, the selector 22 selects the output of the counter 20 based on the output of the controller 18, and thus the counting output of the counter 20 is input into the write address decoder circuit 24 in place of the write address at the normal operation. The write address decoder circuit 24 decodes the counting output of the counter 20 and generates decoder outputs in the order of the register 12-m to 12-0. Thus, the AND gates 28-m to 28-0 sequentially enter the permitted state and the output from the controller 18 is at a logic level 1 so that second sift clocks 1002 to 1005 are sequentially output to the registers 12-m to 12-0 from the AND gates 28-m to 28-0 in synchronization with the counting operation of the counter 20. Therefore, the register 12-m which has received the input of the first shift clock 1002 copies the contents of the register 12-2 at the previous stage, and a processing of copying the data contents from the register at the previous stage to the register at the next stage is repeated similarly. When the first shift clock 1005 is input into the register 12-0 at the head address, in this case, the data in the first register 12-m copied in the scan connection configuration circuit 14 is copied in a higher-order shifted manner by 1 bit. Thereafter, when the shift signal SCK 1 is interrupted, the storage device at the highest-order bit n in the register 12-0 at the head address, that is, the first storage device 60-0n at the right end of the register 12-0 in FIG. 8B is supplied with the second shift clock SCK2 from a clock terminal 50 so that the shift-in for copying the shift data of the external shift register input terminal 44 into the first storage device 60-0n is performed and the 1-bit shift output from the memory array 10 is completed. Similarly below, until all the remaining data in the memory array 10 is output to the outside from the shift register output terminal 48, the scan control circuit 16 repeats the same operation.

Figures 10A, 10B, 10C, 10D:
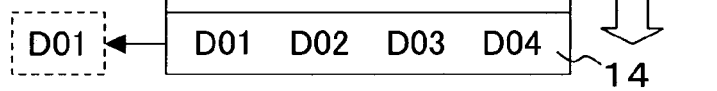

FIGS. 10A to 10D schematically show the scan operation of the register file according to the present invention by exemplifying a memory array of (4 addresses)×(4 data). FIG. 10A shows an initial state of the scan starting, where data D01-to D16 are stored in the registers 12-0 to 12-3 in the memory array. In this state, first, as shown in FIG. 10B, the data D01 to D04 in the register 12-3 at the last stage are copied into the scan connection configuration circuit 14. Thereby, the head data D01 is output to the outside as a shift register output. Next, as shown in FIG. 10C, the data D05 to D08 in the register 12-2 are copied into the register 12-3. Next, as shown in FIG. 10D, data D09 to D12 in the register 12-1 are copied into the register 12-2. Further, as shown in FIG. 10E, the data D13 to D16 in the register 12-0 are copied into the register 12-1. Furthermore, as shown in FIG. 10F, the data D02 to D04 except for the head 1-bit data D01 copied into the scan connection configuration circuit 14 are copied to a position which is shifted by 1 bit in the register 12-1. Then, in FIG. 10G, shift data S01 is copied from the outside into the highest-order bit at the left side of the register 12-0. FIGS. 10A to 10G show one-time register shift operation for outputting one item of data from the memory array to the outside. Next, as shown in FIG. 10H, the data D05 to D08 in the register 12-3 are copied into the scan connection configuration circuit 14. At this time, the data DOS at the least significant bit is output from the shift register output terminal to the outside. Thereafter, when the processing similar as in FIGS. 10C to 10G is repeated and the second shift operation is terminated, the state enters as shown in FIG. 10I and the second shift data S02 is input. When the similar processing is repeated, the third shift data D03 enters an input state as in FIG. 10J, FIG. 10K shows the start state of the final shift operation, and only the final data D16 at the scan starting remain in this case. Also in this case, the similar processing is repeated so that all the data D01 to D16 present in the memory array are finally output to the outside as in FIG. 10L and the shift data S01 to S16 which has been newly input embed the memory array.

Figure 11:
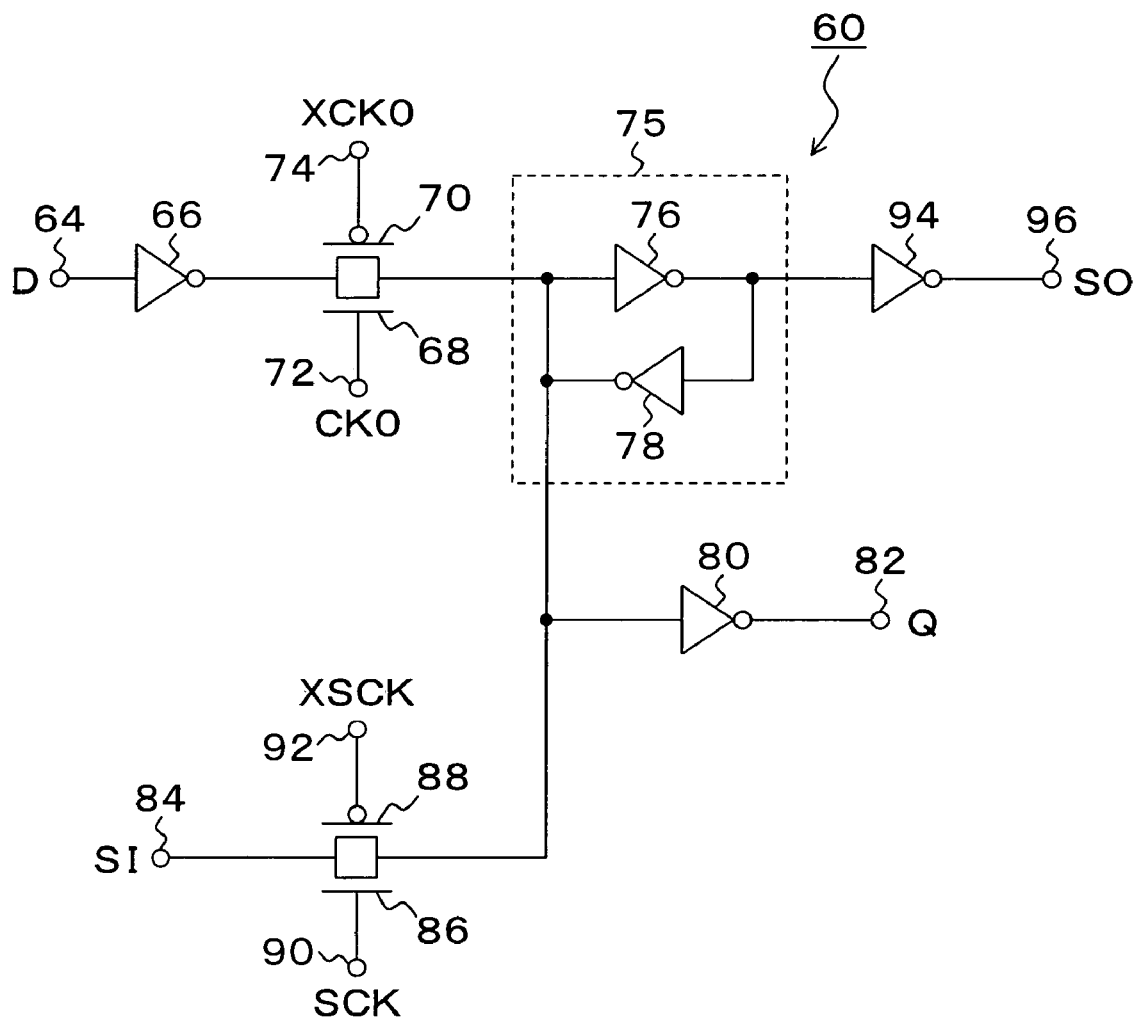
FIG. 11 is a circuit diagram of a first storage device used in the memory array of FIGS. 8A and 8B.

FIG. 11 is a circuit diagram of an embodiment of the first storage devices 60-00 to 60-mn provided in the registers 12-0 to 12-m in the memory array 10 shown in FIGS. 8A and 8B, that is, in the registers 12-0 to 12-m extracted in FIG. 9. In FIG. 11, the first storage device 60 comprises a data input terminal 64, a data output terminal 82, a shift register input terminal 84 and a shift register output terminal 96. An input inverter 66 is provided after the data input terminal 64, dual-type gates 68 and 70 are provided, and then a latch 74 is provided thereafter. The latch 74 feedback-connects the inverter 76 and 78 to each other. An input side of the latch 74 is connected to the data output terminal 82 via an output inverter 80. The configuration of the latch 74 comprising the data input terminal 64, the inverter 66, the gates 68, 70 and the inverters 76, 78, the inverter 80 and the data output terminal 82 comprises the same circuit configuration as the conventional storage device constituted of a master flip-flop only latch shown in FIG. 4. Additionally, in the present invention, the dual-type gates 86 and 88 are provided after the shift input terminal 84 and the output thereof is input and connected to the latch 74. Further, an output of the latch 75 is connected to the latch output terminal 96 via a latch output inverter 94. On the other hand, the dual-type gates 68 and 70 for data input are input with a data clock CK0 and its inverted clock XCK0 from the clock terminals 72 and 74. The clock terminals 90 and 92 of the dual-type gates 86 and 88 for shift input are input with a shift clock SCK and its inverted clock XSCK.

Figure 5:
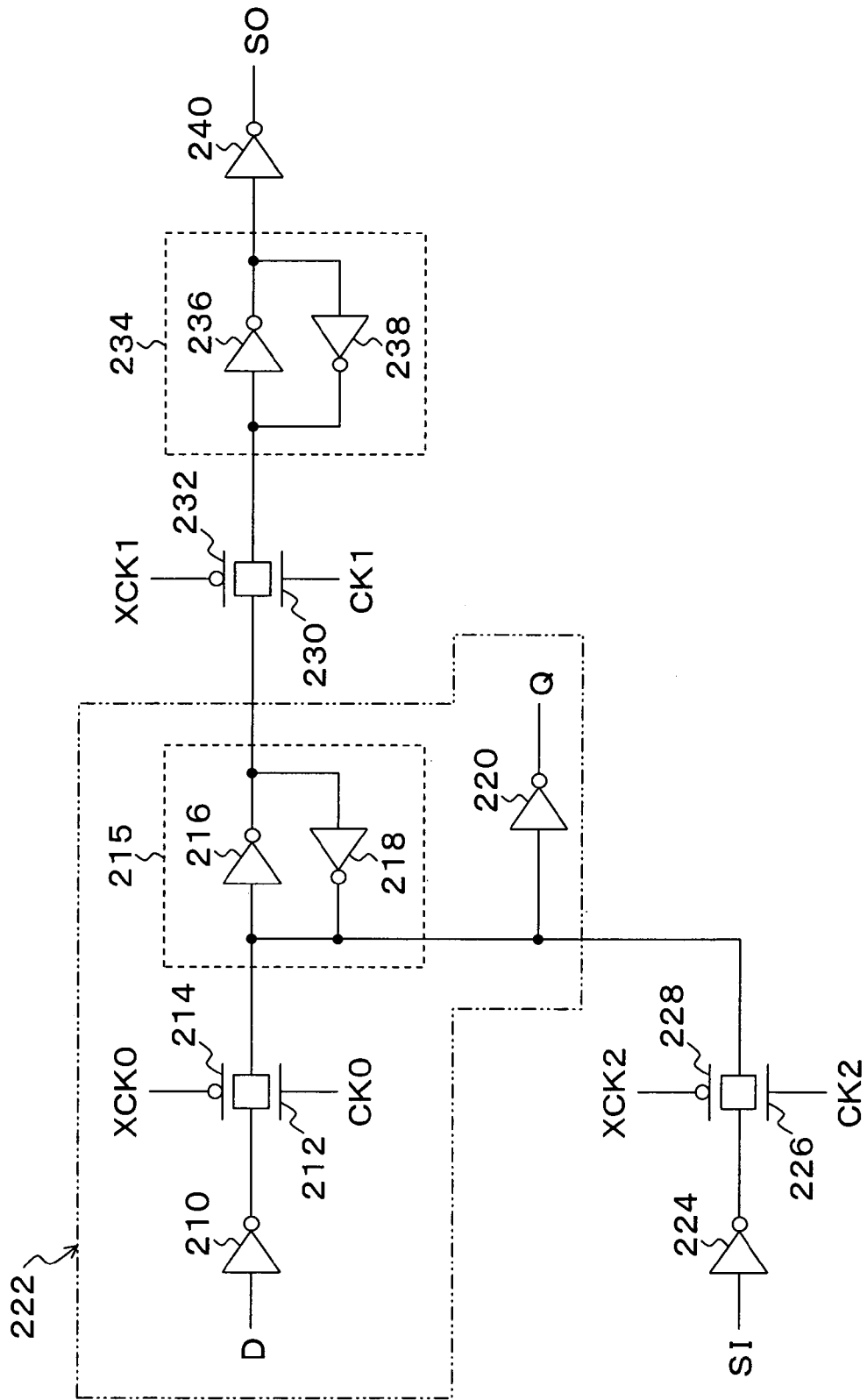
FIG. 5 is a circuit diagram of a conventional storage device constituted of a master-slave flip-flop.

In the register operation at the normal operation of the memory array, the data clock CLK0 and its inverted clock XCK0 are input into the dual-type gates 68 and 70 to open the gates so that the data D at the data input terminal 64 is inverted in the inverted 66 to be sent to the latch 74 and inverted data of the data D is latched by the mutual feedback operation by the inverters 76 and 78. The data latched by this latch 74 is inverted in the inverted 80 and is indicated as the data D at the data output terminal 82. On the other hand, at the time of the scan operation, the shift clock SCK and its inverted clock XSCK are input into the dual-type gates 86 and 88 to open the gates so that the shift data SI at the shift register input terminal 84 is input and held in the latch 74. The shift data held in this latch 74 is inverted in the inverter 94 and is indicated at the shift register output terminal 96. The first storage device 60 used for the memory array 10 according to the present invention is a circuit where only the dual-type gates 86, 88 and the inverter 94 are added to the storage device constituted of a master flip-flop only latch in FIG. 4, and the circuit is remarkably simplified even when the same scan operation is enabled as compared with the conventional storage device in a master-slave flip-flop structure for scan operation shown in FIG. 5. Specifically, since the first storage device 60 in FIG. 11 uses two transistors for the inverter and the dual gates, respectively, and the number of used transistors reaches 14 so that the circuit configuration is remarkably simplified as compared with 22 transistors used in the storage device for realizing the conventional scan operation in FIG. 5 and the size of the semiconductor chip when constituting the register file can be reduced. On the contrary to 10 transistors used for the storage device having no scanning function of FIG. 4, the scanning function can be realized only by adding four transistors.

Figure 12:
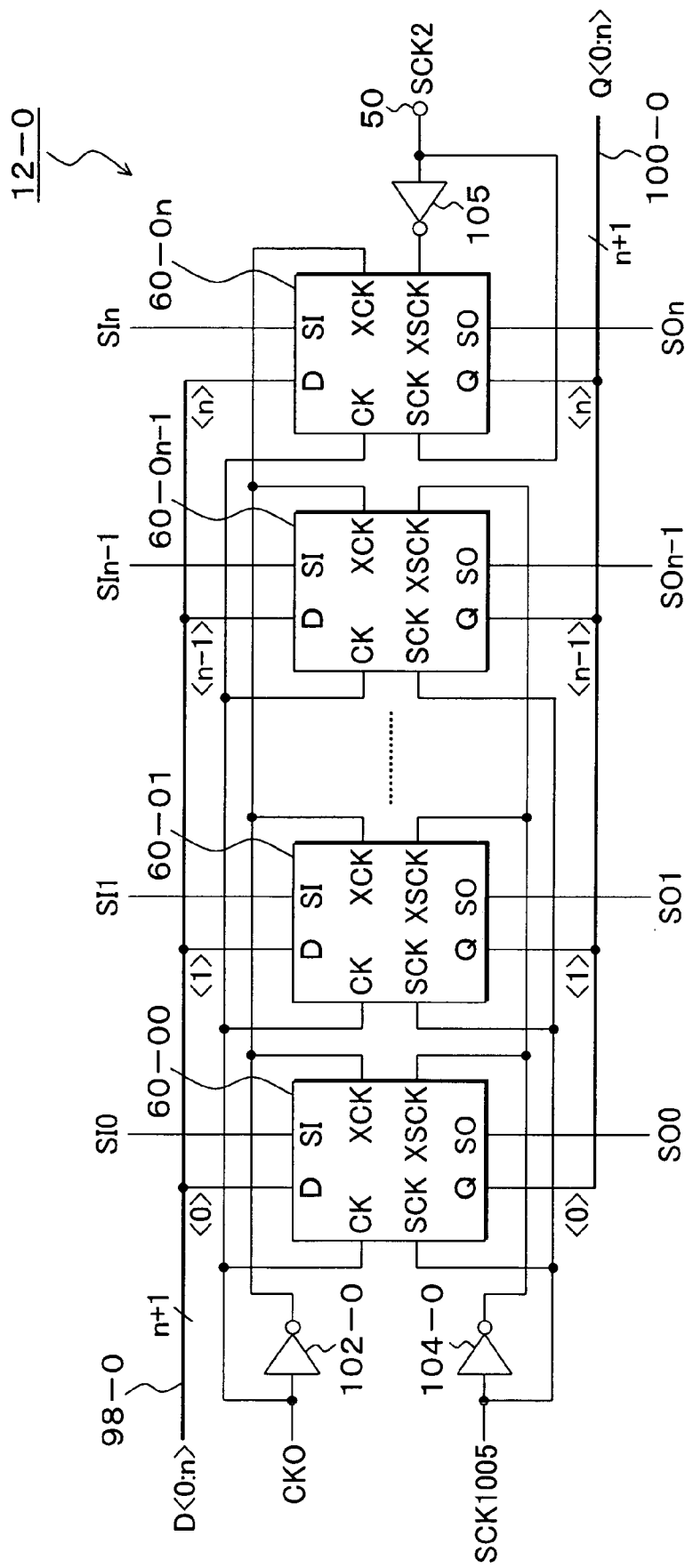
FIG. 12 is a circuit block diagram of a head register in the memory array of FIGS. 8A and 8B.

FIG. 12 is a circuit block diagram of the register 12-0 at the head address position in the memory array 10 in FIGS. 8A and 8B. The register 12-0 arranges therein the first storage devices 60-00 to 60-0n in the data direction, each of which comprises a circuit configuration shown in FIG. 11. Thus, the first storage devices 60-00 to 60-0n each comprise the data input terminal D, the data output terminal Q, the shift input terminal SI and the shift output terminal SO. Further, each device comprises a data clock terminal CK, its clock terminal XCK, a shift clock terminal SCK and its inverted shift clock terminal XSCK as the clock terminals. The data input terminal D in the first storage devices 60-00 to 60-0n is provided with a n+1-bit signal line from a write data bus 98-0 and the signal line is set on 1-bit basis at each data input terminal. Output lines from the data output terminals Q are collected and extracted as a n+1-bit read data bus 100-0. The data clock terminals CK in the first storage devices 60-00 to 60-0n are connected with a clock line of the data clock CK0 from the outside and its inverted data clock terminals XCK are connected with a clock line inverted in an inverter 102-0. On the other hand, the shift output terminals SO in the first storage devices 60-00 to 60-0n are connected to the shift input terminal SI in the register 12-1 at the next stage at the same bit position. On the other hand, the shift input terminals SI in the first storage devices 60-00 to 60-0n are connected with the shift output terminals SO in the second storage devices 62-1 to 62-n except for the maximum bit provided in the scan connection configuration circuit 14 in a 1-bit shifted manner by the shift signal lines 62-1 to 62-n as shown in FIG. 9. The shift input terminal SI in the first storage device 60-0n at the highest-order bit in the register 12-0 is connected to the external shift register input terminal 44 as shown in FIG. 9. The shift clock terminals SCK in the first storage devices 60-00 to 60-0n−1 except for the first storage device 60-0n at the highest-order bit are input with the first shift clock 1005 from the AND gate 28-0 shown in FIGS. 8A and 8B, and its inverted shift clock XSCK is input with an inverted shift clock inverted in an inverter 104-0. On the other hand, in the first storage device 60-0n at the highest-order bit n, the clock terminal 50 is input with the second shift clock SCK2 and an inverted clock inverted in the inverter 105 is input into the inverted shift clock terminal XSCK at the same time.

Figure 13:
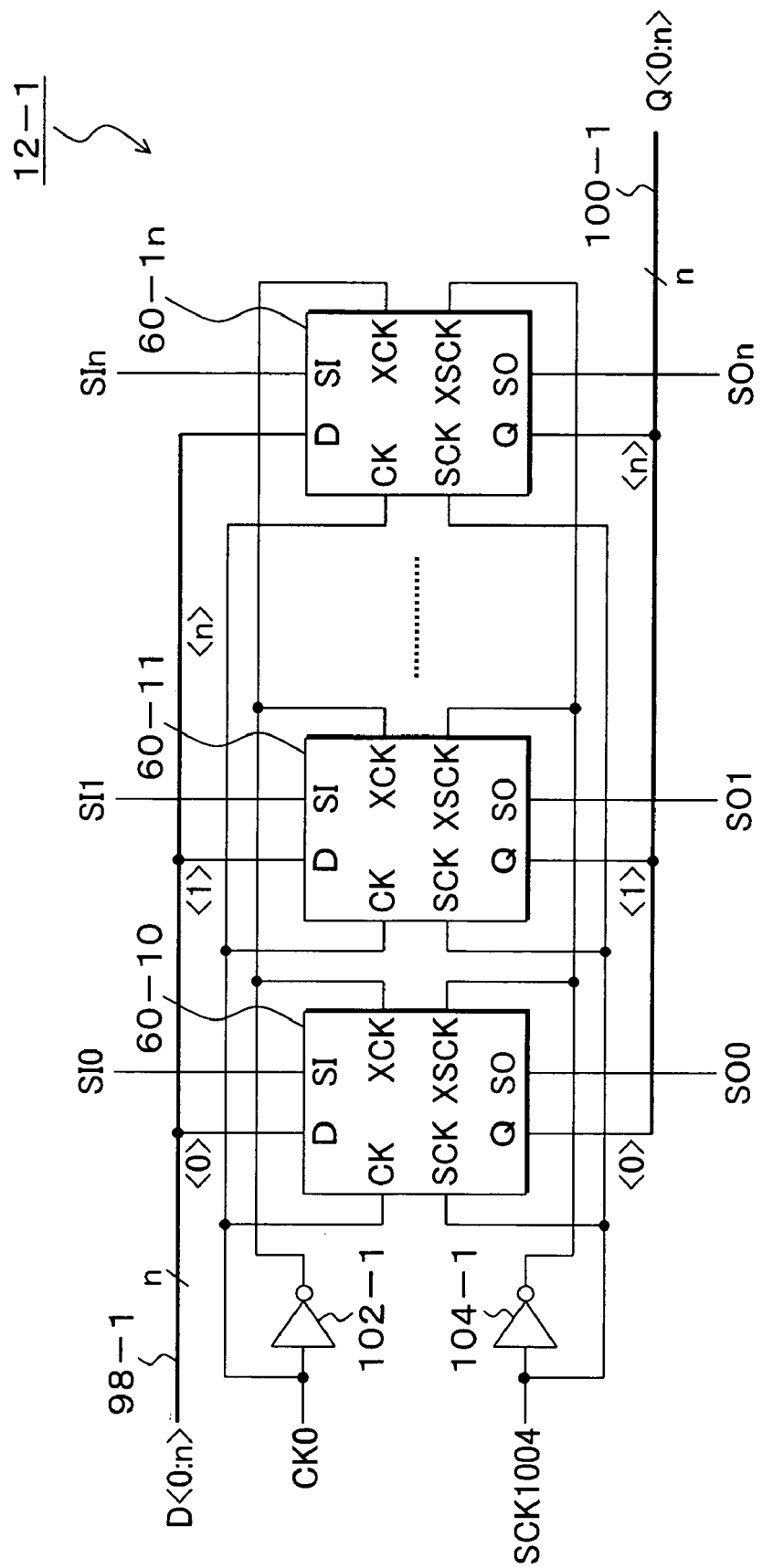
FIG. 13 is a circuit block diagram of a second register in the memory array of FIGS. 8A and 8B.

FIG. 13 is a circuit block diagram of the register 12-1 at the second address in the memory array 10 in FIGS. 8A and 8B. In the register 12-1, the first storage devices 60-10 to 60-1n having the circuit configuration of FIG. 11 are arranged in the data direction and each bit line from the write data bus 98-1 is connected to the data input terminal D and the output lines from the data output terminals Q are collected and extracted as the read data bus 100-1. The data write clock CK0 is input into the respective data clock terminals CK and is inverted in the inverter 102-1 to be input into the inverted clock terminal XCK as the inverted clock. The shift input terminals SI and the shift output terminals SO in the first storage devices 60-10 to 60-1n are interconnected in the shift input/output at the same bit position between the register 12-0 of FIG. 9 at the previous stage and the register 12-2 at the next stage. The circuit configuration of this register 12-1 is identical to that in the remaining registers 12-2 to 12-n.

Figure 14:
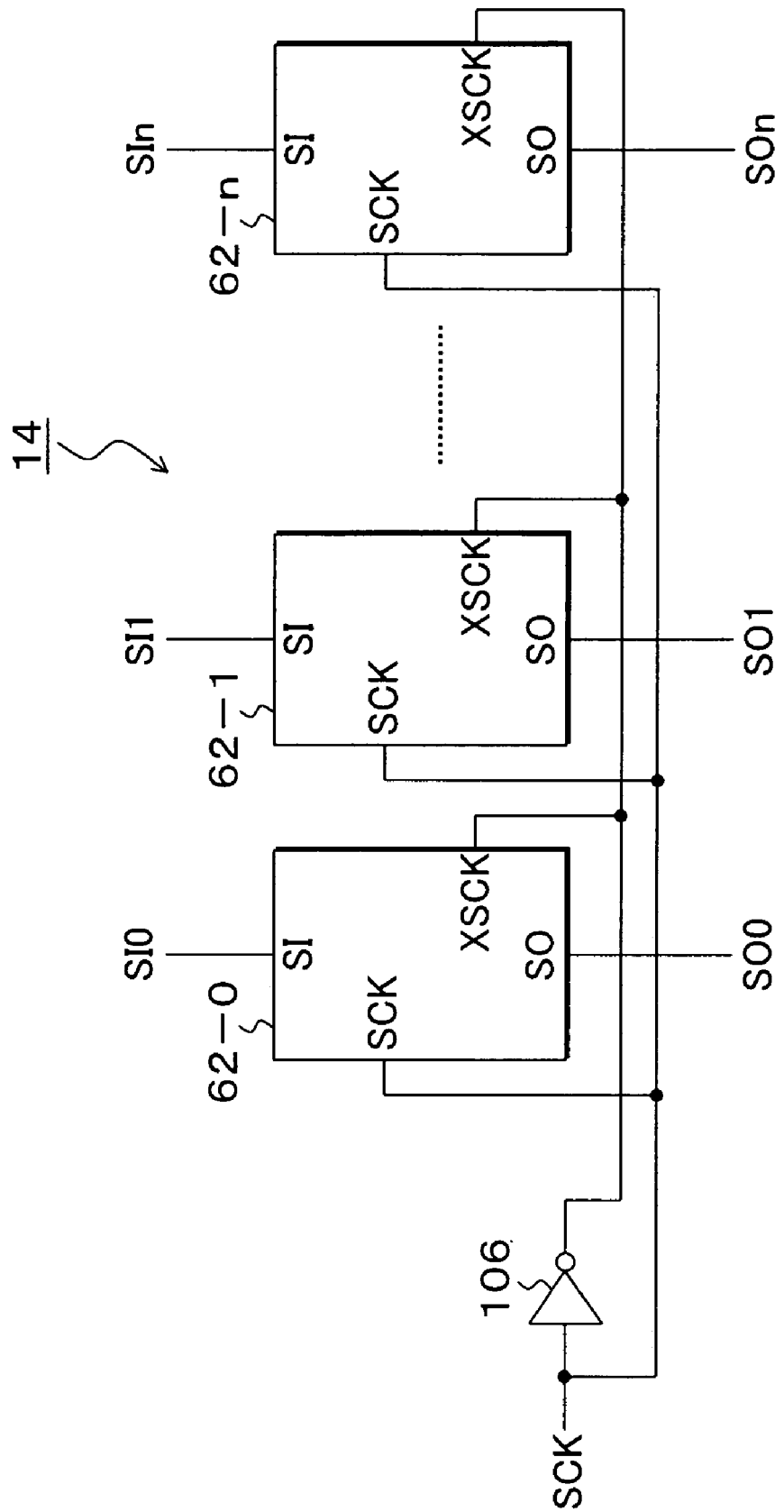
FIG. 14 is a circuit block diagram of a scan connection configuration circuit of FIGS. 8A and 8B.

FIG. 14 is a circuit block diagram of the scan connection configuration circuit 14 in FIGS. 8A and 8B. In the scan connection configuration circuit 14, the second storage devices 62-0 to 62-n are arranged in the data direction as many as the first storage devices in each register in the memory array 10. The second storage devices 62-0 to 62-n each have the shift input terminal SI, the shift output terminal SO, the shift clock terminal SCK and its inverted terminal XSCK. The shift input terminal SI in the second storage devices 62-0 to 62-n is connected at the same bit position to the shift output terminal SO in the register 12-n in the memory array 10 at the previous stage as in FIG. 9. On the other hand, the shift output SO in the second storage device 62-0 is extracted to the outside and is connected to the shift register output terminal 48 as shown in FIG. 9. The shift output terminals SO in the remaining second storage devices 62-1 to 62-n are connected to the shift input terminals SI in the first storage devices 60-00 to 60-0n−1 at a 1-bit shifted position in the register 12-0 at the head position of the memory array 10 in FIG. 9. In the shift clock input terminals in the second storage devices 62-0 to 62-n, a first shift clock SCK 1 is input from the controller 18 of FIGS. 8A and 8B into the shift clock terminal SCK, and at the same time the clock inverted in the inverter 106 is input into the inverted shift clock terminal XCK.

Figure 15:
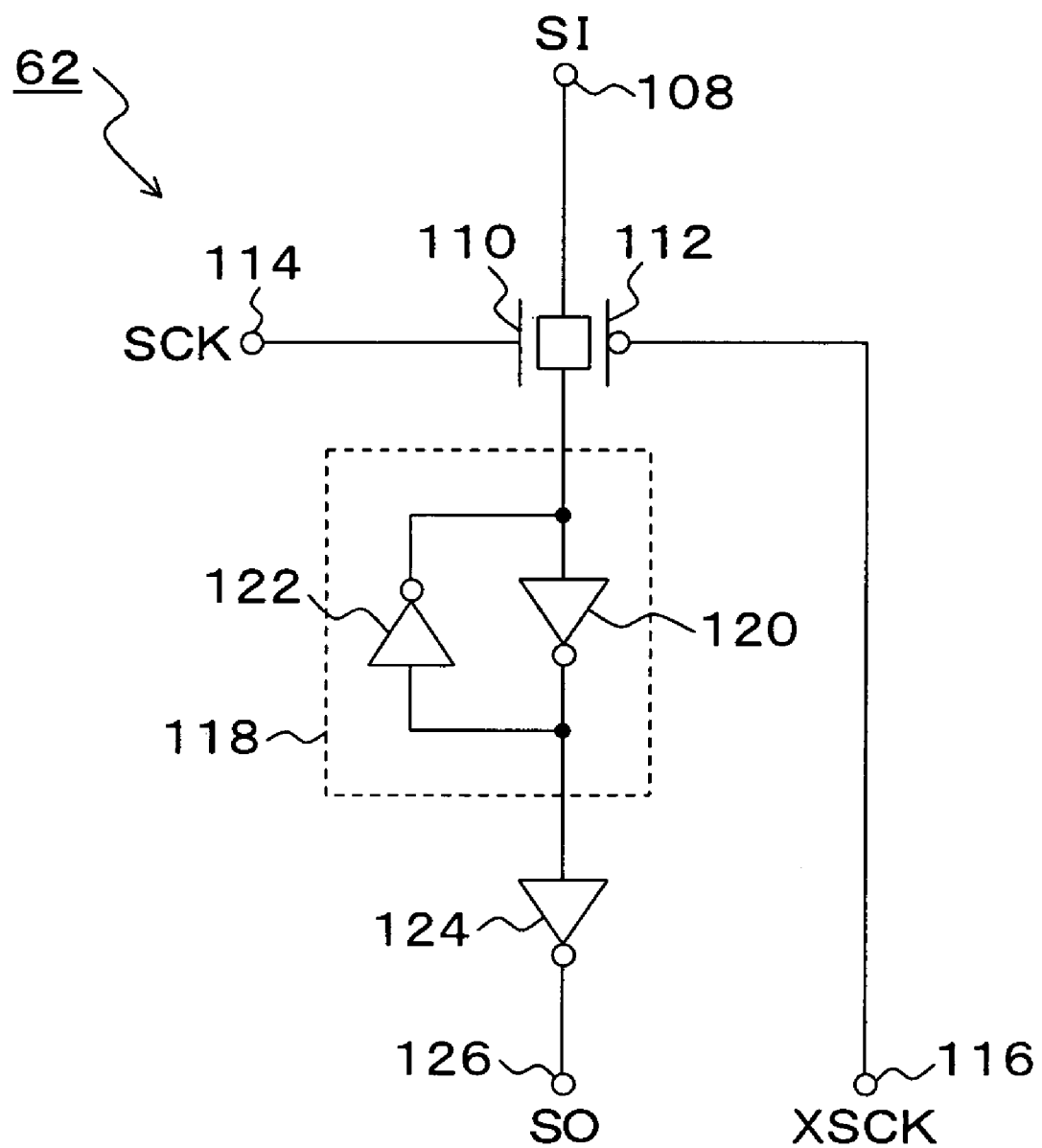
FIG. 15 is a circuit diagram of a second storage device used in the scan connection configuration circuit of FIG. 13.

FIG. 15 is a circuit diagram of the second storage device used in the scan connection configuration circuit 14 of FIGS. 10I to 10L. The second storage device 62 has a shift input terminal 108 and a shift output terminal 126. The shift input terminal 108 feedback-connects a pair of inverters 120 and 122 with each other in a latch 118. An output of the latch 118 is connected to the shift output terminal 126 via an inverter 124. A clock terminal 114 is connected to one gate 110 in the dual-type gates, and is input with a shift clock SCK. A clock terminal 116 is connected to the other gate 112 and is input with an inverted shift clock XSCK of the shift clock SCK. This second storage device 62 has the same circuit as the master flip-flop only latch storage device used in the conventional memory array having no scanning function as shown in FIG. 4, and is used as a storage device only for shift data.

FIGS. 16A to 16I are time charts of the scan operation according to the embodiment of FIGS. 8A and 8B. At the time of the test operation such as internal diagnosis of the register file according to the present invention, the shift signal SCK rises from 0 to 1 as shown in FIG. 16A to be added to the shift control terminal 36. The controller 18 which has received the shift signal SCK outputs the first shift clock 1001 of FIG. 16B to the scan connection configuration circuit 14. Thereby, the data in the register 12-m is copied into the scan connection configuration circuit 14 and the head bit data is output from the shift register output terminal 48 to the outside. Subsequently, the controller 18 operates the counter 20 during the remaining period of the shift signal SCK1, and outputs a control signal which enters level 1 for the selector 22 and the AND gates 28-0 to 28-m. Thus, as shown in FIG. 16C, the counter 20 start the counting operation, and outputs the counter outputs corresponding to the addresses 1, 2, 3, ..., m in the memory array 10 to the write address decoder circuit 24 via the selector 22 which has been switched by the control signal from the controller 18. Therefore, the write address decoder circuit 24 sequentially generates decoder outputs as shown in FIGS. 16E to 16H in correspondence to the counting outputs from the counter 22, and at this time outputs the first clocks 1003, 1004 and 1005 in the order of the registers 12-n to 12-0 via the AND gates 28-0 to 28-n in the permitted state. Thus, in the memory array 10, the data copying is repeatedly performed from the register at the previous stage to the register at the rear stage in the order of the registers 12-n to 12-1. As shown in FIG. 16H, when the first shift clock 1005 is output to the register 12-0 at the head address, the remaining bit data except for the maximum bit in the scan connection configuration circuit 14 is copied into the register in a 1-bit shifted manner. When a sufficient time elapses after the shift signal SCK1 of FIG. 16A has been obtained, the second shift clock SCK2 of FIG. 16I is given to the clock terminal 50. In this case, a time after the shift signal SCK1 is obtained until the second shift clock SCK2 is obtained is several-hundred times of the system operation cycle depending on the performance of the tester. Therefore, until the second shift clock SCK2 is obtained, the first shift operation in the memory array 10 by the shift signal SCK 1 is reliably completed. When the second shift clock SCK2 of FIG. 16I is given to the clock terminal 50, the second shift clock SCK 2 and the inverted shift clock inverted in the inverter 105 are input, for example, into the first storage device 60-0n in the register 12-0 shown in FIG. 12 at the head address, and the shift data from the external shift clock input terminal 44 is copied into the second storage device 62-0n. Hereinafter, the scan operation is repeated until all the data held in the memory array 10 is output from the shift data output terminal 48 to the outside.

FIGS. 16A and 16B are circuit block diagrams of other embodiment of the register file according to the present invention where the memory array is divided into two.

In the embodiment of FIGS. 16A and 16B, the memory array is divided into a divided memory array 10-1 at the upper address side and a divided memory array 10-2 at the lower address side. The divided memory array 10-1 is provided with registers 12-10 to 12-1m and a scan connection configuration circuit 14-1 is arranged therefor. Similarly, the divided memory array 10-2 is provided with register 12-20 to 12-2m and a scan connection configuration circuit 14-2 is provided therefor. A specific configuration of the divided memory arrays 10-1 and 10-2 and the scan connection configuration circuits 14-1 and 14-2 are basically the same as the circuit configuration of FIGS. 8A and 8B. The shift input/output between the divided memory array 10-1 and the divided memory array 10-2 connects the shift output SO0 at the least significant bit in the scan connection configuration circuit 14-1 at the divided memory array 10-1 to the shift input SIn at the highest-order bit position in the register 12-20 at the head address in the divided memory array 10-2. The external shift register input/output terminal 44 is connected to SIn of the shift input device of the storage device at the highest-order bit in the register 12-10 at the upper address side. Further, the shift register output terminal 48 for extracting the data to the outside is connected to the shift output SO0 of the storage device at the highest-order bit in the scan connection configuration circuit 14-2 at the divided memory array 10-2.

A file writing unit for the divided memory arrays 10-1 and 10-2 is constituted of a lower address decoder 24-1, a higher write address decoder circuit 24-2 and AND gates 26-0 to 26-2m. A register write address for the address terminal 34 is input into the higher address decoder circuit 24-2 and the lower address decoder circuit 24-1, a decoder output is generated at any one of the lower address decoder circuit 24-1 and the higher address decoder circuit 24-2 to cause a corresponding AND gate to enter the permitted state and the data clock CK0 to pass, and the external data is written in parallel into the corresponding register from the data terminal 38. The file reading units in the divided memory arrays 10-1 and 10-2 are provided with read select circuits 38-1 and 38-2, respectively, and both the read select circuits 38-1 and 38-2 are selected at the output of the read address circuit (not shown) by the address lower bit. The outputs of the read select circuits 38-1 and 38-2 are input into a read select circuit 38-3 and the read select circuit 38-3 selects and outputs any one reading operation selected at the higher bit or lower bit of the read address.

The scan control circuit 16 comprises the controller 18, the counter 20 and the selector 22 similarly as in the embodiment of FIGS. 8A and 8B, and utilizes the lower write address decoder circuit 24-1 as an address decoder circuit. The decoder output of the lower write address decoder circuit 24-1 used for scan control is given to the divided memory arrays 10-1 and 10-2, respectively. That is, the divided memory arrays 10-1 and 10-2 provide, for the registers 12-10 to 12-1m and the registers 12-20 to 12-2m, the AND gates 28-10 to 28-1m and the AND gates 28-20 to 28-2m, respectively, which receive the input at level 1 at the time of the scan operation in response to the control signal from the controller 18 to enter the permitted state, and one decoder output from the lower write address decoder circuit 24-1 in this state is output to the AND gate at the same register position in the divided memory arrays 10-1 and 10-2 so that the parallel shift operation is performed for each designated register of the divided memory arrays 10-1 and 10-2. This point is similar as in the scan connection configuration circuits 14-1 and 14-2, which are input in parallel with a first shift clock 2001 from the controller 18, respectively, to perform the parallel scan operation.

Figure 17A:
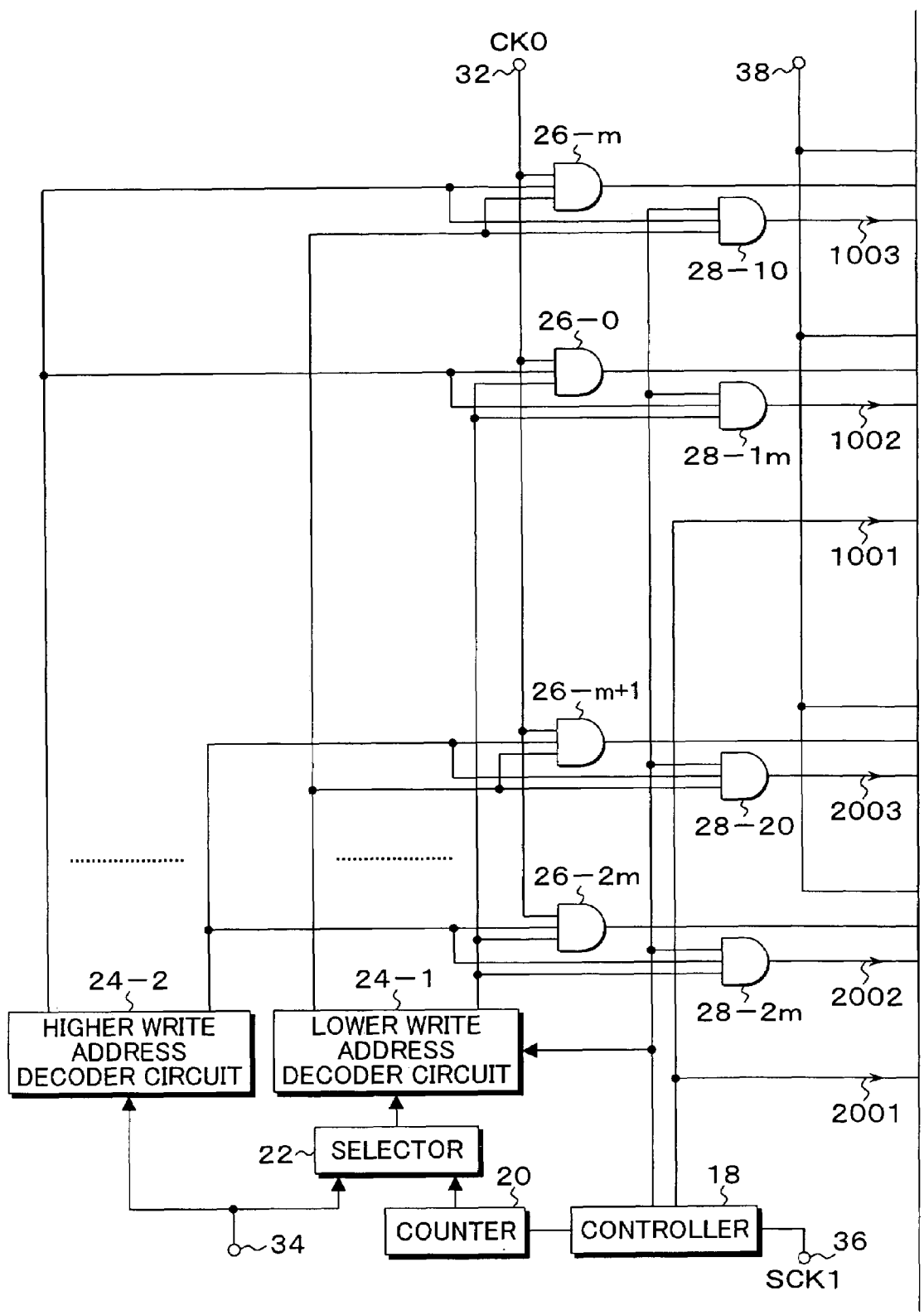
FIGS. 17A and 17B are circuit block diagrams of other embodiment according to the present invention where the memory array is divided into two.
Figure 17B:
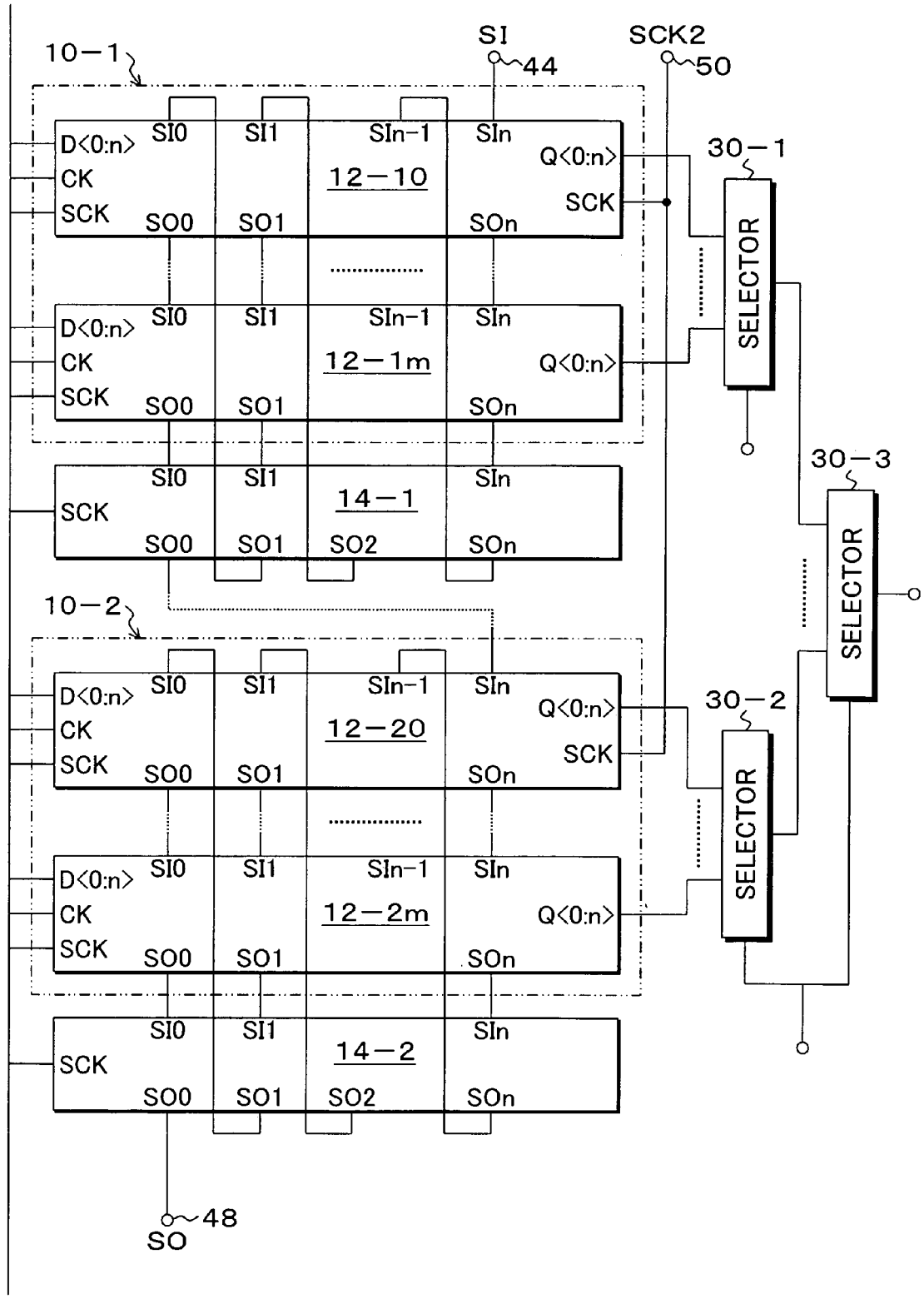

FIGS. 17A to 17J are time charts of the scan operation of the embodiment of FIGS. 16A and 16B. When the scan operation is started, the shift signal SCK1 as shown in FIG. 17A is obtained and the controller 18 outputs the first shift clock 1001 to the scan connection configuration circuits 14-1 and 14-2 as shown in FIG. 17D so that the data copying from the registers 12-1m and 12-2m is performed in parallel. Subsequently, the counting output of the counter 20 is given to the lower write address decoder circuit 24-1 via the selector 22 so that the second shift clocks 1000 to 1003 are sequentially input into the registers 12-1m to 12-10 via the AND gates 28-10 to 28-1m as shown in FIGS. 17E to 17G, and in parallel with this, the second shift clocks 2001 to 2003 are input into the registers 12-2m to 12-20 as shown in FIGS. 17G to 17I so that the copying using the shift operation between the registers in the divided memory arrays 10-1 and 10-2 is performed in parallel. When a sufficient time as much as several-hundred times of the system operation cycle elapses after the shift signal SCK1 of FIG. 17A has generated, the second shift clock SCK2 is given to the clock terminal 50 as shown in FIG. 17J, and the shift data of the external shift register input terminal 44 is copied into the first storage devices at the highest-order bit n in the register 12-10 in FIGS. 16A and 16B, and at the same time the data of the least significant bit in the scan connection configuration circuit 14-1 at the divided memory array 10-1 at the front stage is copied into the first storage devices at the highest-order bit n in the register 12-20. Hereinafter, the same operation is similarly repeated until the data present in starting to scan all the remaining divided memory arrays 10-1 and 10-2 is output from the shift register input/output terminal 48 to the outside.

The memory arrays 10-1 and 10-2 are divided in this manner to perform the scan operation, when the number of registers in the memory array increases to deepen the address, the clock pulses for the addresses have to be sequentially generated by the counting operation of the counter, which takes a time for one shift, but the memory array is divided into two as shown in the embodiment of FIGS. 16A and 16B so that one scan operation can be performed for half time, thereby improving the processing efficiency of the scan operation when the address of the register file is deepened.

The embodiment of FIGS. 16A and 16B exemplifies the case where the memory array is divided into two, but when the number of registers increases and the address is deepened, the memory array may be divided into three or four.

The present invention exemplifies the register file as the high-speed storage apparatus used in the CPU or MPU, but the present invention is not limited thereto and can be applied to an appropriate storage apparatus as long as it is a storage apparatus using several storage devices arranged in the data direction. Further, the present invention is not limited to the above embodiments, and includes appropriate modifications without losing the spirit and advantages. Furthermore, the present invention is not limited by the numerals indicated in the above embodiments.

The invention claimed is:

1. A register file, comprising:
a memory array where a predetermined number of first storage devices, each first storage device including a data input terminal, a data output terminal, a shift input terminal and a shift output terminal arranged on an address basis to constitute a plurality of registers, wherein
a shift output terminal of a first storage device at a front stage is connected to a shift input terminal of another first storage device in each register except for registers at a head address and a last address, a shift input terminal of a first storage device at a highest-order bit position in a head register is a shift register input terminal for inputting shift data from the outside, data in a data input terminal of a first storage device is latched in response to an input of a data clock for the first storage device to be output to a data output terminal of the first storage device, and shift data in a shift input terminal of a first storage device is latched in response to an input of a shift clock for the first storage device to be output to the shift output terminal;

a scan connection configuration circuit where second storage devices each second storage device comprising a shift input terminal and a shift output terminal, as many as the first storage devices are arranged in a register in the memory array following a last register in the memory array, wherein a shift input of each second storage device is connected with a latch output of each first storage device at a same bit position in a register having the last address in the memory array, a shift output of each second storage device except for a second storage device at the least significant bit is connected to a shift input terminal of each first storage device at 1-bit higher position of the head register in the memory array, a shift output terminal of a second storage device at the least significant bit position is a shift register output terminal for outputting shift data to the outside, and data in the shift input terminal of a second storage device is latched in response to an input of a second shift clock for the second storage device to be output to the shift output terminal of the second storage device;

a file writing unit for designating an arbitrary address of the memory array and writing data in a register corresponding to the arbitrary address;

a file reading unit for designating an arbitrary address of the memory array and reading data from a register corresponding to the arbitrary address;

a scan control circuit where a first shift clock is input in an order starting from the last register in the scan connection configuration circuit and the memory array to the head register, wherein, until all the data held in the memory array when scan started, is output from the shift register output terminal, data is first copied from a first storage device in the last register of the memory array to each second storage device in the scan connection configuration circuit in parallel, shift data is externally output from a second storage device at the least significant bit in the scan connection configuration circuit to the shift register output terminal, then the data is sequentially copied from each first storage device at an upper register in the memory array to each first storage device at a lower register in parallel, and then data in each second storage device except for the highest-order bit in the scan connection configuration circuit is copied in parallel into each first storage device except for the highest-order bit in the head register, a second shift clock being finally input into a first storage device at the highest-order bit at the head register to copy shift data input into a shift register input terminal.

2. A register file according to claim 1, wherein each first storage device provided in the memory array further comprises:
a data input inverter for inverting and inputting data in the data input terminal;
a first gate circuit which switches to an ON state in response to an input of a data clock for a data clock input terminal and receiving output data of the data inverter;
a second gate circuit which switches to an ON state in response to an input of a shift clock for a shift clock input terminal and receiving shift data of the shift input terminal;
a latch circuit for feedback-connecting a pair of inverters to each other and inputting and latching data passed when the first gate circuit and the second gate circuit are in respective ON states;
a data output inverter connected to an input side of the latch circuit for outputting inverted data to the data output terminal; and
a latch output inverter connected to an output side of the latch circuit for outputting inverted data to the shift output terminal.

3. A register file according to claim 1, wherein the number of registers used in the storage device in the memory array is at least 14.

4. A register file according to claim 1, wherein the second storage device provided in the scan connection configuration circuit comprises:
an input inverter for inverting and inputting data in the shift input terminal;
a gate circuit which switches to an ON state in response to an input of a shift clock for a shift clock input terminal and passing shift data in the shift input terminal;
a latch circuit for feedback-connecting a pair of inverters to each other and inputting and latching data passed when the gate circuit is in the ON state; and
an output inverter connected to an input side of the latch circuit for outputting inverted data to the shift output terminal.

5. A register file according to claim 1, wherein the scan control circuit comprise:
a counter for counting the number corresponding to the number of registers in the memory array;
a control unit for outputting a first shift clock to the scan connection configuration circuit at a beginning of a shift period for outputting one bit from the memory array, and outputting a memory array shift signal indicative of a remaining period to operate the counter;
a decoder circuit for decoding a counting output of the counter and outputting a first shift clock in the order of the last register to the head register in the memory array following the scan connection configuration circuit; and
a gate circuit for opening a gate of each register in response to a memory array shift signal from the control unit and passing a first shift clock from the decoder circuit.

6. A register file according to claim 5, wherein the decoder circuit is a write address decoder circuit in the data writing unit, and is further provided with a selector circuit for switching an input of a write address for the write address decoder circuit into an output of the counter in response to a memory array shift signal from the control unit.

7. A register file according to claim 1, wherein the memory array is divided into at least two portions, wherein
each portion including a continuous sequence of addresses,
a shift register output terminal at a last register in a portion of the memory array at the front stage is connected to a shift register input terminal at a head register in a following portion of the memory, and the at least two portions of the memory array are operated in parallel by the scan control circuit.

8. A storage device for register file, comprising:
a data input terminal;
a data output terminal;
a data clock terminal;
a shift input terminal;
a shift output terminal; and
a shift clock terminal;
a data input inverter for inverting and inputting data in the data input terminal;
a first gate circuit which switches to an ON state in response to an input of a data clock to the data clock input terminal and receiving output data of the data inverter;
a second gate circuit which switches to an ON state in response to an input of a shift clock for a shift clock input terminal and receiving shift data in the shift input terminal;
a latch circuit for feedback-connecting a pair of inverters to each other and inputting and latching data passed when the first gate circuit and the second gate circuit are in respective ON states;
a data output inverter connected to an input side of the latch circuit for outputting inverted data to the data output terminal; and
a latch output inverter connected to an output side of the latch circuit for outputting inverted data to the shift output terminal.

9. A storage device for register file according to claim 8, wherein the number of registers to be used is at least 14.

* * * * *

UNITED STATES PATENT AND TRADEMARK OFFICE
CERTIFICATE OF CORRECTION

PATENT NO.       : 7,430,695 B2
APPLICATION NO.  : 11/320984
DATED            : September 30, 2008
INVENTOR(S)      : Tomohiro Tanaka It is certified that error appears in the above-identified patent and that said Letters Patent is hereby corrected as shown below:

Column 17, Line 2, change "memory," to --memory array,--.

Signed and Sealed this

Ninth Day of December, 2008

JON W. DUDAS
*Director of the United States Patent and Trademark Office*